(12) United States Patent
Lue

(10) Patent No.: US 10,777,566 B2
(45) Date of Patent: Sep. 15, 2020

(54) 3D ARRAY ARRANGED FOR MEMORY AND IN-MEMORY SUM-OF-PRODUCTS OPERATIONS

(71) Applicant: MACRONIX INTERNATIONAL CO., LTD., Hsinchu (TW)

(72) Inventor: Hang-Ting Lue, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 16/037,281

(22) Filed: Jul. 17, 2018

(65) Prior Publication Data
US 2019/0148393 A1    May 16, 2019

Related U.S. Application Data

(60) Provisional application No. 62/584,356, filed on Nov. 10, 2017.

(51) Int. Cl.
*G11C 7/18* (2006.01)
*H01L 27/11556* (2017.01)
(Continued)

(52) U.S. Cl.
CPC ........ *H01L 27/11556* (2013.01); *G11C 5/025* (2013.01); *G11C 7/1006* (2013.01);
(Continued)

(58) Field of Classification Search
CPC .............. G11C 5/025; G11C 7/18; G11C 8/14
(Continued)

(56) References Cited

U.S. PATENT DOCUMENTS

| 4,219,829 A | 8/1980 | Dorda et al. |
| 4,987,090 A | 1/1991 | Hsu et al. |

(Continued)

FOREIGN PATENT DOCUMENTS

| CN | 1998012 B | 11/2010 |
| CN | 105718994 A | 6/2016 |

(Continued)

OTHER PUBLICATIONS

Soudry, et al. "Hebbian learning rules with memristors," Center for Communication and Information Technologies CCIT Report #840, Sep. 1, 2013, 16 pages.

(Continued)

*Primary Examiner* — Han Yang
(74) *Attorney, Agent, or Firm* — Haynes Beffel & Wolfield LLP

(57) ABSTRACT

A device comprises a 3D array of cells arranged for execution of a sum-of-products operation, the cells in the 3D array disposed in cross-points of a plurality of vertical lines and a plurality of horizontal lines, the cells having programmable conductances. A gate driver is coupled to gate lines which applies control gate voltages which in combination with the programmable conductances of the cells correspond to weights $W_{xyz}$ of terms in the sum-of-products operation. An input driver applies voltages to cells in the array corresponding to input variables $X_y$. A sensing circuit senses a sum of currents from cells in the 3D array corresponding to the sum-of-products.

20 Claims, 28 Drawing Sheets

(51) Int. Cl.

| | |
|---|---|
| *H01L 27/06* | (2006.01) |
| *H01L 27/108* | (2006.01) |
| *G11C 16/04* | (2006.01) |
| *G11C 11/4097* | (2006.01) |
| *H01L 21/822* | (2006.01) |
| *H01L 27/112* | (2006.01) |
| *G11C 5/02* | (2006.01) |
| *G11C 7/10* | (2006.01) |
| *G11C 8/14* | (2006.01) |
| *H01L 27/11582* | (2017.01) |
| *H01L 27/1157* | (2017.01) |

(52) U.S. Cl.
CPC ............... *G11C 7/18* (2013.01); *G11C 8/14* (2013.01); *G11C 11/4097* (2013.01); *G11C 16/0416* (2013.01); *H01L 21/8221* (2013.01); *H01L 27/0688* (2013.01); *H01L 27/10802* (2013.01); *H01L 27/1157* (2013.01); *H01L 27/11206* (2013.01); *H01L 27/11582* (2013.01); *G11C 2213/71* (2013.01)

(58) Field of Classification Search
USPC ........................................ 365/185.13, 185.17
See application file for complete search history.

(56) References Cited

U.S. PATENT DOCUMENTS

| | | | |
|---|---|---|---|
| 5,586,073 | A | 12/1996 | Hiura et al. |
| 6,107,882 | A | 8/2000 | Gabara et al. |
| 6,313,486 | B1 | 11/2001 | Kencke et al. |
| 6,829,598 | B2 | 12/2004 | Milev |
| 6,906,940 | B1 | 6/2005 | Lue |
| 6,960,499 | B2 | 11/2005 | Nandakumar et al. |
| 7,368,358 | B2 | 5/2008 | Ouyang et al. |
| 7,747,668 | B2 | 6/2010 | Nomura et al. |
| 8,203,187 | B2 | 6/2012 | Lung et al. |
| 8,275,728 | B2 | 9/2012 | Pino |
| 8,432,719 | B2 | 4/2013 | Lue |
| 8,589,320 | B2 | 11/2013 | Breitwisch et al. |
| 8,630,114 | B2 | 1/2014 | Lue |
| 8,860,124 | B2 | 10/2014 | Lue et al. |
| 9,064,903 | B2 | 6/2015 | Mitchell et al. |
| 9,379,129 | B1 | 6/2016 | Lue et al. |
| 9,430,735 | B1 | 8/2016 | Vali et al. |
| 9,431,099 | B2 | 8/2016 | Lee et al. |
| 9,524,980 | B2 | 12/2016 | Lue |
| 9,536,969 | B2 | 1/2017 | Yang et al. |
| 9,589,982 | B1 | 3/2017 | Cheng |
| 9,698,156 | B2 | 7/2017 | Lue |
| 9,698,185 | B2 | 7/2017 | Chen et al. |
| 9,710,747 | B2 | 7/2017 | Kang et al. |
| 9,754,953 | B2 | 9/2017 | Tang et al. |
| 10,242,737 | B1 | 3/2019 | Lin et al. |
| 2003/0122181 | A1 | 7/2003 | Wu |
| 2005/0287793 | A1 | 12/2005 | Blanchet et al. |
| 2010/0182828 | A1 | 7/2010 | Shima et al. |
| 2010/0202208 | A1 | 8/2010 | Endo et al. |
| 2011/0063915 | A1 | 3/2011 | Tanaka et al. |
| 2011/0106742 | A1 | 5/2011 | Pino |
| 2011/0286258 | A1 | 11/2011 | Chen et al. |
| 2011/0297912 | A1* | 12/2011 | Samachisa ............ G11C 13/003 257/5 |
| 2012/0044742 | A1 | 2/2012 | Narayanan |
| 2012/0235111 | A1 | 9/2012 | Osano et al. |
| 2013/0075684 | A1 | 3/2013 | Kinoshita et al. |
| 2014/0063949 | A1 | 3/2014 | Tokiwa |
| 2014/0119127 | A1 | 5/2014 | Lung et al. |
| 2014/0149773 | A1 | 5/2014 | Huang et al. |
| 2014/0268996 | A1 | 9/2014 | Park |
| 2015/0008500 | A1 | 1/2015 | Fukumoto et al. |
| 2016/0141337 | A1* | 5/2016 | Shimabukuro ...... H01L 27/2481 365/51 |
| 2016/0181315 | A1 | 6/2016 | Lee et al. |
| 2016/0247579 | A1 | 8/2016 | Ueda et al. |
| 2016/0308114 | A1 | 10/2016 | Kim et al. |
| 2016/0336064 | A1 | 11/2016 | Seo et al. |
| 2016/0358661 | A1 | 12/2016 | Vali et al. |
| 2017/0092370 | A1 | 3/2017 | Harari |
| 2017/0148517 | A1 | 5/2017 | Harari |
| 2017/0169887 | A1 | 6/2017 | Widjaja |
| 2017/0270405 | A1 | 9/2017 | Kurokawa |
| 2017/0309634 | A1 | 10/2017 | Noguchi et al. |
| 2017/0316833 | A1* | 11/2017 | Ihm ..................... G11C 16/28 |
| 2017/0317096 | A1 | 11/2017 | Shin et al. |
| 2018/0121790 | A1 | 5/2018 | Kim et al. |
| 2018/0350823 | A1* | 12/2018 | Or-Bach ........... H01L 27/11529 |
| 2019/0148393 | A1 | 5/2019 | Lue |
| 2019/0220249 | A1 | 7/2019 | Lee et al. |
| 2019/0244662 | A1 | 8/2019 | Lee et al. |
| 2019/0286419 | A1 | 9/2019 | Lin et al. |
| 2020/0026993 | A1 | 1/2020 | Otsuka |

FOREIGN PATENT DOCUMENTS

| | | |
|---|---|---|
| CN | 105789139 A | 7/2016 |
| EP | 2048709 A2 | 4/2009 |
| TW | 201523838 A | 6/2015 |
| TW | 201618284 A | 5/2016 |
| TW | 201639206 A | 11/2016 |
| TW | 201732824 A | 9/2017 |
| TW | 201802800 A | 1/2018 |
| WO | 2012009179 A1 | 1/2012 |
| WO | 2012015450 A1 | 2/2012 |
| WO | 2016060617 A1 | 4/2016 |
| WO | 2017091338 A1 | 6/2017 |

OTHER PUBLICATIONS

U.S. Office Action in U.S. Appl. No. 15/887,166 dated Jan. 30, 2019, 18 pages.

EP Extended Search Report from 18155279.5-1203 dated Aug. 30, 2018, 8 pages.

EP Extended Search Report from EP18158099.4 dated Sep. 19, 2018, 8 pages

Schuller et al., " Neuromorphic Computing: From Materials to Systems Architecture," US Dept. of Energy, Oct. 29-30, 2015, Gaithersburg, MD, 40 pages.

U.S. Appl. No. 15/873,369, filed Jan. 17, 2018, entitled "Sum-of-Products Accelerator Array," Lee et al., 52 pages.

U.S. Appl. No. 15/887,166, filed Feb. 2, 2018, entitled "Sum-of-Products Array for Neuromorphic Computing System," Lee et al., 49 pages.

U.S. Appl. No. 15/895,369, filed Feb. 13, 2018, entitled "Device Structure for Neuromorphic Computing System," Lin et al., 34 pages.

U.S. Appl. No. 15/922,359, filed Mar. 15, 2018, entitled "Voltage Sensing Type of Matrix Multiplication Method for Neuromorphic Computing System," Lin et al., 40 pages.

Lue et al., "A Novel 3D AND-type NVM Architecture Capable of High-density, Low-power In-Memory Sum-of-Product Computation for Artificial Intelligence Application," IEEE VLSI, Jun. 18-22, 2018, 2 pages.

U.S. Office Action in U.S. Appl. No. 15/922,359 dated Jun. 24, 2019, 8 pages.

U.S. Office Action in related case U.S. Appl. No. 15/873,369 dated May 9, 2019, 8 pages.

Jang et al., "Vertical cell array using TCAT(Terabit Cell Array Transistor) technology for ultra high density NAND flash memory," 2009 Symposium on VLSI Technology, Honolulu, HI, Jun. 16-18, 2009, pp. 192-193.

Kim et al. "Multi-Layered Vertical Gate NAND Flash Overcoming Stacking Limit for Terabit Density Storage," 2009 Symposium on VLSI Technology Digest of Papers, Jun. 16-18, 2009, 2 pages.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technolgy Digest of Technical Papers, pp. 186-187. (cited in parent).

(56) References Cited

OTHER PUBLICATIONS

Ohzone et al., "Ion-Implanted Thin Polycrystalline-Silicon High-Value Resistors for High-Density Poly-Load Static RAM Applications," IEEE Trans. on Electron Devices, vol. ED-32, No. 9, Sep. 1985, 8 pages.

Sakai et al., "A Buried Giga-Ohm Resistor (BGR) Load Static RAM Cell," IEEE Symp. on VLSI Technology, Digest of Papers, Sep. 10-12, 1984, 2 pages.

Seo et al., "A Novel 3-D Vertical FG NAND Flash Memory Cell Arrays Using the Separated Sidewall Control Gate (S-SCG) for Highly Reliable MLC Operation," 2011 3rd IEEE International Memory Workshop (IMW), May 22-25, 2011, 4 pages.

Tanaka H., et al., "Bit Cost Scalable Technology with Punch and Plug Process for Ultra High Density Flash Memory," 2007 Symp. VLSI Tech., Digest of Tech. Papers, pp. 14-15.

Whang, SungJin et al. "Novel 3-dimensional Dual Control-gate with Surrounding Floating-gate (DC-SF) NAND flash cell for 1Tb file storage application," 2010 IEEE Int'l Electron Devices Meeting (IEDM), Dec. 6-8, 2010, 4 pages.

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

U.S. Office Action in U.S. Appl. No. 15/873,369 dated Dec. 4, 2019, 5 pages.

U.S. Office Action in U.S. Appl. No. 15/887,166 dated Jul. 10, 2019, 18 pages.

U.S. Office Action in U.S. Appl. No. 15/922,359 dated Oct. 11, 2019, 7 pages.

U.S. Office Action in U.S. Appl. No. 16/233,414 dated Oct. 31, 2019, 22 pages.

U.S. Office Action in related U.S. Appl. No. 16/297,504 dated Feb. 4, 2020, 15 pages.

Chen et al., "Eyeriss: An Energy-Efficient reconfigurable accelerator for deep convolutional neural networks," IEEE ISSCC, Jan. 31-Feb. 4, 2016, 3 pages.

EP Extended Search Report from EP19193290.4 dated Feb. 14, 2020, 10 pages.

Gonugondla et al., "Energy-Efficient Deep In-memory Architecture for NAND Flash Memories," IEEE International Symposium on Circuits and Systems (ISCAS), May 27-30, 2018, 5 pages.

Wang et al., "Three-Dimensional NAND Flash for Vector-Matrix Multiplication," IEEE Trans. on Very Large Scale Integration Systems (VLSI), vol. 27, No. 4, Apr. 2019, 4 pages.

TW Office Action from TW Application No. 10820980430, dated Oct. 16, 2019, 6 pages (with English Translation).

\* cited by examiner

3D ARRAY ARRANGED FOR MEMORY AND IN-MEMORY SUM-OF-PRODUCTS OPERATIONS

PRIORITY APPLICATION

This application claims the benefit of U.S. Provisional Patent Application No. 62/584,356 filed 10 Nov. 2017, which application is incorporated herein by reference.

BACKGROUND

Field

The present invention relates to circuitry that can be used to perform sum-of-products operations.

Description of Related Art

In neuromorphic computing systems, machine learning systems and circuitry used for some types of computation based on linear algebra, the sum-of-products function can be an important component. The function can be expressed as follows:

$$f(x_i) = \sum_{i=1}^{M} W_i x_i$$

In this expression, each product term is a product of a variable input $X_i$ and a weight $W_i$. The weight $W_i$ can vary among the terms, corresponding for example to coefficients of the variable inputs $X_i$.

The sum-of-products function can be realized as a circuit operation using cross-point array architectures in which the electrical characteristics of cells of the array effectuate the function.

For high-speed implementations, it is desirable to have a very large array so that many operations can be executed in parallel, or very large sum-of-products series can be performed.

It is desirable to provide structures for sum-of-products operations suitable for implementation in large arrays.

SUMMARY

A device is described that comprises a 3D array of cells arranged for execution of a sum-of-products operation, the cells in the 3D array disposed in cross-points of a plurality of vertical lines and a plurality of horizontal lines, the cells having programmable conductances, which can be implemented using charge storage structures disposed at cross-points of the plurality of vertical lines and the plurality of horizontal lines. A gate driver can be coupled to gate lines which applies control gate voltages which in combination with the programmable conductances of the cells correspond to weights $W_{xyz}$ of terms in the sum-of-products operation. An input driver applies voltages to cells in the array corresponding to input variables $X_y$. A sensing circuit senses a sum-of-currents from cells in the 3D array, the sum-of-currents corresponding to the sum-of-products.

In embodiments described herein, one of the plurality of vertical lines and the plurality of horizontal lines can comprise cell body lines, and the other of the plurality of vertical lines and the plurality of horizontal lines can comprise gate lines. The cell body lines each comprise parallel first and second conductive lines extending along the cell body line, and a plurality of cell bodies including charge storage structures at cross-points with gate lines, the cell bodies connected between the first and second conductive lines and configured as first and second source/drain terminals and channels of cells in the 3D array. The gate lines each comprise a conductor configured as control gates of cells in the 3D array, adjacent to the charge storage structures at cross-points with the cell body lines.

A plurality of input lines is connected to the first conductive lines in the cell body lines. A plurality of output lines is connected to the second conductive lines in the cell body lines.

A gate driver is coupled to the gate lines which applies control gate voltages which, in combination with the charge in the charge storage structures of the cells, corresponds to weights $W_{xyz}$ of terms in the sum-of-products operation, in response to address signals to select cells in the 3D array as terms in the sum-of-products operation.

An input driver is coupled to the plurality of input lines which applies voltages corresponding to input variables $X_y$. A sensing circuit is coupled to the plurality of output lines to sense a sum-of-currents in a set of output lines in the plurality of output lines.

The 3D array can comprise a number X of input lines, a number Y of gate lines in each of a number Z of levels of cells. Each stack of cells can be coupled to one of the input lines and one of the output lines. The gate lines can be disposed in each of the Z levels of cells, so that each stack includes Z cells in parallel between one of the input lines and one of the output lines.

The cell body lines can comprise semiconductor strips having a first conductively doped region configured as the first conductive line, a second conductively doped region configured as the second conductive line, and a third region between the first and second conductively doped regions having a doping profile of the channels of the cells.

The 3D array can comprise isolation structures in trenches between the stacks, and between vertical lines in the plurality of vertical lines in the trenches.

In one embodiment, vertical lines in the plurality of vertical lines are the cell body lines. The gate lines comprise a plurality of stacks of conductive strips separated by trenches, and the cell body lines are disposed vertically in the trenches. The cell body lines comprise semiconductor strips disposed vertically in the trenches, the semiconductor strips having a first conductively doped region configured as the first conductive line, a second conductively doped region configured as the second conductive line, and a third region between the first and second conductively doped regions having a doping profile of the channels of the cells.

In an alternative embodiment, vertical lines in the plurality of vertical lines are the gate lines. The cell body lines comprise a plurality of stacks of semiconductor strips separated by trenches, the semiconductor strips having a first conductively doped region configured as the first conductive line, a second conductively doped region configured as the second conductive line, and a third region between the first and second conductively doped regions having a doping profile of the channels of the cells, and the gate lines comprise a plurality of conductive strips disposed vertically in the trenches.

Devices described herein can comprise an array of cells having a number X of columns, a number Y of rows and a number Z of levels of cells, cells in the array each comprising a transistor having programmable conductance. Such devices can comprise gate lines arranged along the Y rows in corresponding levels of the Z levels coupled to the cells in respective rows in the corresponding levels, input lines arranged along the X columns and overlying the array, and output lines overlying the array.

A stack of cells in such devices includes cells in the Z levels of the array at a given row (y) and column (x) of the array disposed along a first vertical conductive line and a second vertical conductive line, where the first vertical conductive line is connected to a corresponding input line on the given column (x) and the second vertical conductive line is connected to an output line. The transistors in the cells in the stack (at column x, row y for z=0 to Z-1) are electrically coupled in parallel between corresponding first and second vertical conductive lines in this example.

The first-mentioned stack of cells can be disposed on the first sidewall of a particular stack of conductive strips in the plurality of stacks of conductive strips. A second stack of cells can be disposed in the Z levels of the array at the given row (y) and column (x+1) of the array, the second stack of cells being disposed on the second sidewall of the particular stack of conductive strips. The first-mentioned stack of cells can be offset from the second stack of cells in a direction along which the conductive strips in the particular stack of conductive strips extend.

A sensing circuit in these devices is coupled to the output lines. Current on a particular stack at row y and column x represents a sum-of-products of the input X(x) applied to the input line on column x coupled to the particular stack times respective weight factors W(x, y, z) of the cells in the Z levels in the particular stack. For an output line coupled to a plurality of stacks, the current on the output line represents a sum of the currents on the plurality of stacks including the particular stack.

Such devices can be implemented in very large arrays, comprising a plurality of stacks of conductive strips separated by trenches, each of the stacks having a first sidewall and a second sidewall. The programmable conductance can be implemented by charge storage structures disposed on the first and second sidewalls of the stacks of conductive strips.

Methods for manufacturing a neuromorphic memory device as described herein are also provided.

A 3D stackable NOR Flash architecture for memory and for artificial intelligence AI applications is described that comprises a 3D array of cells arranged for execution of a sum-of-products operation, the cells in the 3D array disposed in cross-points of a plurality of vertical lines and a plurality of horizontal lines, the cells having programmable conductances, which can be implemented using charge storage structures disposed at cross-points of the plurality of vertical lines and the plurality of horizontal lines. A gate driver can be coupled to gate lines which applies control gate voltages which in combination with the programmable conductances of the cells correspond to weights $W_{wyz}$ of terms in the sum-of-products operation. An input driver applies voltages to cells in the array corresponding to input variables $X_y$. A sensing circuit senses a sum-of-currents from cells in the 3D array, the sum-of-currents corresponding to the sum-of-products. A plurality of input lines is connected to the input driver, and a plurality of output lines is connected to the sensing circuit, wherein the plurality of output lines is arranged orthogonal to the plurality of input lines.

In embodiments described herein, one of the plurality of vertical lines and the plurality of horizontal lines can comprise cell body lines, and the other of the plurality of vertical lines and the plurality of horizontal lines can comprise gate lines. The cell body lines each comprise parallel first and second conductive lines extending along the cell body line, and a plurality of cell bodies including charge storage structures at cross-points with gate lines, the cell bodies connected between the first and second conductive lines and configured as first and second source/drain terminals and channels of cells in the 3D array. The gate lines each comprise a conductor configured as control gates of cells in the 3D array, adjacent to the charge storage structures at cross-points with the cell body lines.

In embodiments of the 3D stackable NOR Flash architecture, the input lines in the plurality of input lines are connected to the first conductive lines in the cell body lines in respective rows of stacks of cells in a row direction. The output lines in the plurality of output lines are connected to the second conductive lines in the cell body lines in respective columns of stacks of cells in a column direction orthogonal to the row direction.

The cell body lines can comprise semiconductor strips having a first conductively doped region configured as the first conductive line, a second conductively doped region configured as the second conductive line, and a third region between the first and second conductively doped regions having a doping profile of the channels of the cells.

Other aspects and advantages of the present invention can be seen on review of the drawings, the detailed description and the claims, which follow.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
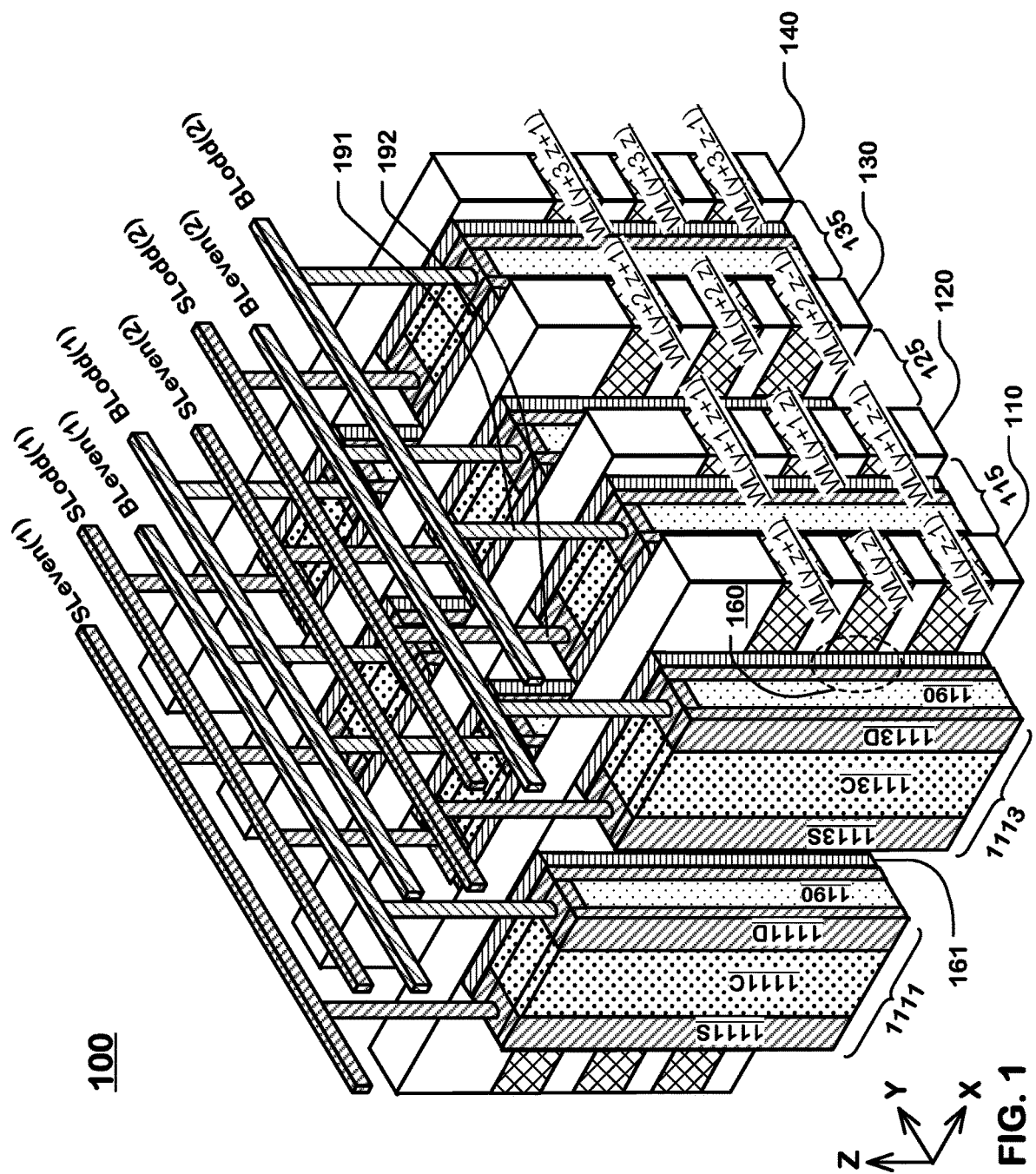
FIG. 1 illustrates a perspective view of an example 3D device comprising a 3D array of cells arranged for execution of a sum-of-products operation in a 3D stackable AND Flash architecture.

FIG. 1 illustrates a perspective view of an example 3D device comprising a 3D array of cells 100 arranged for execution of a sum-of-products operation in a 3D stackable AND Flash architecture.

The cells (e.g. 160) in the 3D array are disposed in cross-points of a plurality of vertical lines and a plurality of horizontal lines. The cells have programmable conductance implemented using charge storage structures 161 disposed at cross-points of the plurality of vertical lines and the plurality of horizontal lines. The programmable conductance can be implemented using other types of memory technologies as well. One of the plurality of vertical lines and the plurality of horizontal lines can comprise cell body lines, and the other of the plurality of vertical lines and the plurality of horizontal lines can comprise gate lines (e.g. WL(y, z−1), WL(y, z) and WL(y, z+1)). In this example, the vertical lines are the cell body lines.

The cell body lines in the illustrated embodiment each comprise parallel first and second conductive lines (e.g. 1111D, 1111S) along the cell body line. A plurality of cell bodies is disposed at cross-points with gate lines. The cell bodies are connected between the first and second conductive lines and configured as first and second source/drain terminals of cells in the 3D array in the first and second conductive lines and channels of cells in the 3D array in a third region (e.g. 1111C) between the first and second conductive lines. The gate lines each comprise a conductor configured as control gates of cells in the 3D array, adjacent to the charge storage structures at cross-points with the cell body lines.

A plurality of input lines (e.g. BLeven(1), BLodd(1), BLeven(2), BLodd(2)) is connected to the first conductive lines (e.g. 1111D, 1113D) in the cell body lines. A plurality of output lines (e.g. SLeven(1), SLodd(1), SLeven(2), SLodd(2)) is connected to the second conductive lines (e.g. 1111S, 1113S) in the cell body lines. First interlayer connectors (e.g. 191) can connect the input lines (e.g. BLodd(2)) to the first conductive lines in the cell body lines, and second interlayer connectors (e.g. 192) can connect the output lines (e.g. SLodd(2)) to the second conductive lines in the cell body lines.

The 3D array in general, can comprise a number X of input lines, a number Y of gate lines in each of a number Z of levels of cells, such that a stack of cells coupled to one of the input lines (e.g. BLeven(2)) and to the gate lines in each of the Z levels of cells (e.g. WL(y, z−1), WL(y, z) and WL(y, z+1)) includes Z cells in parallel between the one of the input lines and one of the output lines. For execution of a sum-of-products operation, current in one stack is a sum-of-products of the input X(y) times the weight W(xyz) of the Z cells in the stack.

The cell body lines comprise semiconductor strips having a first conductively doped region configured as the first conductive line (e.g. 1111D, 1113D), a second conductively doped region configured as the second conductive line (e.g. 1111S, 1113S), and a third region (e.g. 1111C, 1113C) between the first and second conductively doped regions having a doping profile of the channels of the cells.

The 3D array of cells comprises isolation structures (e.g. 1190) between vertical lines in the plurality of vertical lines disposed in trenches between the stacks of gate lines.

In an alternative embodiment, vertical lines in the plurality of vertical lines are the gate lines. The cell body lines comprise a plurality of stacks of semiconductor strips separated by trenches, the semiconductor strips having a first conductively doped region configured as the first conductive line, a second conductively doped region configured as the second conductive line, and a third region between the first and second conductively doped regions having a doping profile of the channels of the cells, and the gate lines comprise a plurality of conductive strips disposed vertically in the trenches.

The device can comprise a plurality of semiconductor strips disposed vertically in contact with the charge storage structures on the first and second sidewalls of the stacks of conductive strips. The semiconductor strips can have a first conductively doped region configured as the first vertical conductive line, a second conductively doped region configured as the second vertical conductive line, and a third region between the first and second conductively doped regions having a doping profile of channels of the cells in the stack of cells.

Cells in the stack of cells can have first current carrying terminals in the first vertical conductive line, second current carrying terminals in the second vertical conductive line, channels in the third region of the semiconductor strips, and gates in the conductive strips in the stack of conductive strips.

The device can comprise a first conductive element connecting the first vertical conductive line in a first semiconductor strip in the plurality of semiconductor strips and the first vertical conductive line in a second semiconductor strip in the plurality of semiconductor strips separated from the first semiconductor strip by an isolation structure, and a second conductive element connecting the second vertical conductive line in the first semiconductor strip and the second vertical conductive line in the second semiconductor strip.

The device can comprise first interlayer connectors connecting the input lines to respective first conductive elements, and second interlayer connectors connecting the output lines to respective second conductive elements.

Figure 2:
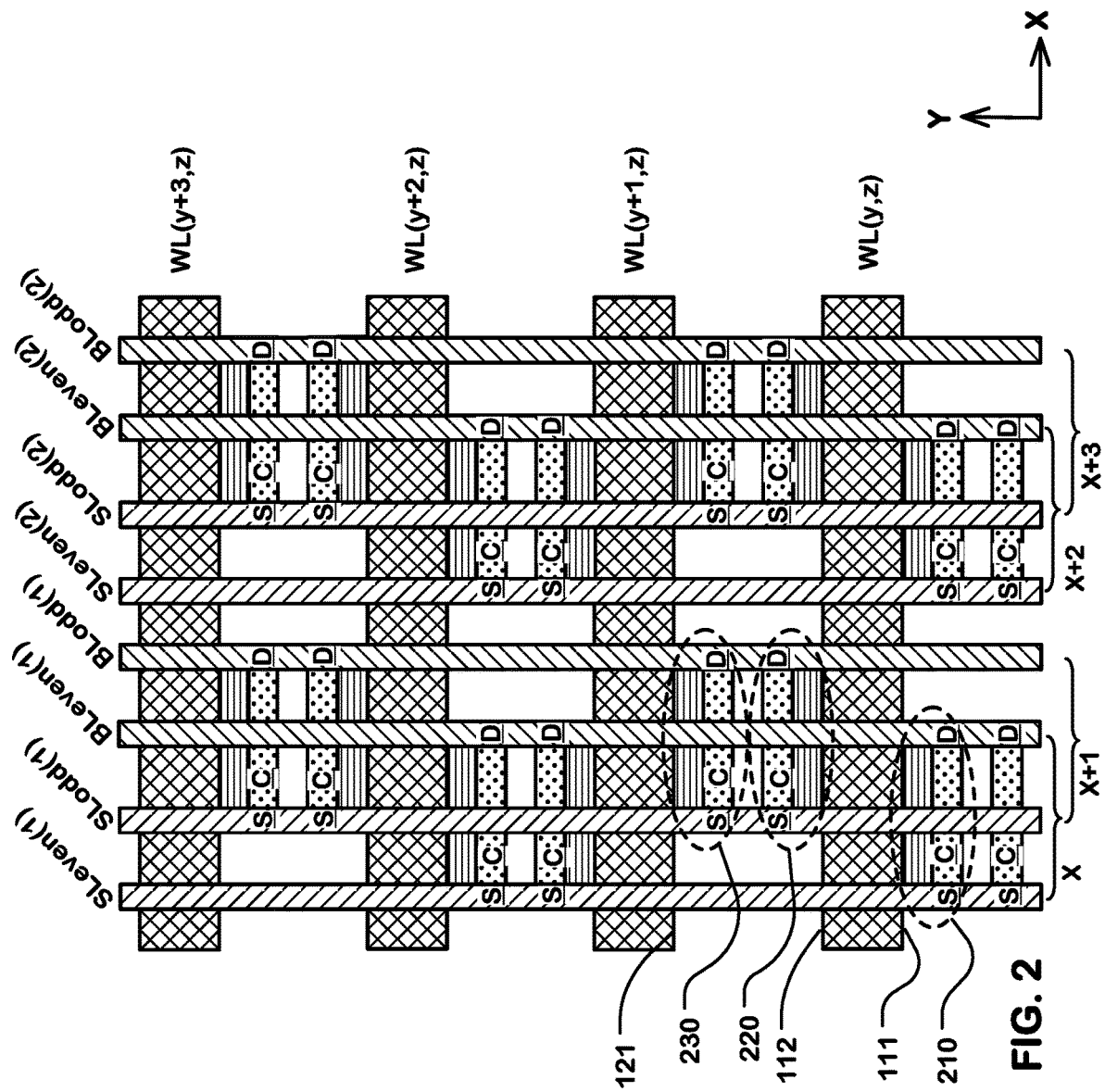
FIG. 2 illustrates a layout view of 16 cells in 4 rows and 4 columns in the 3D array of cells illustrated in FIG. 1.

FIG. 2 illustrates a layout view of 16 stacks of cells in 4 rows and 4 columns in the 3D array of cells illustrated in FIG. 1, at a given level (z) in the Z levels.

Gate lines are implemented using word lines extending in the X-direction (e.g. WL(y, z), WL(y+1, z), WL(y+2, z), WL(y+3, z)) arranged in rows (y, y+1, y+2, y+3) at a given level (z) of the Z levels. Input lines are implemented using bit lines extending in the Y-direction (e.g. BLeven(1), BLodd(1), BLeven(2), BLodd(2)) arranged along columns (e.g. x, x+1, x+2, x+3) and overlying the array. Output lines are implemented using source lines (e.g. SLeven(1), SLodd(1), SLeven(2), SLodd(2)) overlying the array. Output lines are arranged along columns (e.g. x, x+1, x+2, x+3), and paired with input lines in respective columns. For example, output line SLeven(2) is paired with input line BLeven(2) in column (x+2), and output line SLodd(2) is paired with input line BLodd(2) in column (x+3).

As shown in the example of FIG. 2, a first stack of cells in the Z levels of the array at a given row (y) and a given column (x) of the array includes a first cell 210 at a given level (z). The first vertical connector in the first stack of cells is connected to a corresponding input line BLeven(1) on the given column (x), and the second vertical conductive line in the first stack of cells is connected to an output line SLeven(1) on the given column (x).

The first cell 210 in the first stack of cells has a first current-carrying terminal in the first vertical conductive line in the first stack of cells (e.g. D within the oval for 210), a second current-carrying terminal in the second vertical conductive line in the first stack of cells (e.g. S within the oval for 210), a horizontal channel in the semiconductor strip (e.g. C within the oval for 210), and a gate in the gate line WL(y, z).

A second stack of cells in the Z levels of the array at a given row (y) and a given column (x+1) of the array includes a second cell 220 at a given level (z). The second stack of cells includes a first vertical conductive line and a second vertical conductive line (e.g. 311, 312, FIG. 3) on a second sidewall 112 of the first stack of conductive strips including the gate line WL(y, z). The first vertical connector in the second stack of cells is connected to a corresponding input line BLodd(1) on the given column (x+1), and the second vertical conductive line in the second stack of cells is connected to an output line SLodd(1) on the given column (x+1).

The second cell 220 in the second stack of cells has a first current-carrying terminal in the first vertical conductive line in the second stack of cells (e.g. D within the oval for 220), a second current-carrying terminal in the second vertical conductive line in the second stack of cells (e.g. S within the oval for 220), a horizontal channel in the second semiconductor strip (e.g. C within the oval for 220), and a gate in the gate line WL(y, z).

A third stack of cells in the Z levels of the array at a given row (y+1) and a given column (x+1) of the array includes a third cell 230 at a given level (z). The third stack of cells comprises a first conductive line 321 and a second conductive line 322 on a first sidewall 121 of a second stack of conductive strips including the gate line WL(y+1, z). The first vertical connector in the third stack of cells is connected to a corresponding input line BLodd(1) on the given column (x+1), and the second vertical conductive line in the third stack of cells is connected to an output line SLodd(1) on the given column (x+1).

The third cell 230 in the third stack of cells has a first current-carrying terminal in the first vertical conductive line in the third stack of cells (e.g. D within the oval for 230), a second current-carrying terminal in the second vertical conductive line in the third stack of cells (e.g. S within the oval for 230), a horizontal channel in the third semiconductor strip (e.g. C within the oval for 230), and a gate in the gate line WL(y+1, z).

An isolation structure 340 (FIG. 3) is disposed between the second stack of cells including the first cell 220 on the second sidewall 112 of the first stack of conductive strips including the gate line WL(y, z) and the third stack of cells including the third cell 230 on the first sidewall 121 of the second stack of conductive strips including the gate line WL(y+1, z).

The first stack of cells including the first cell 210 on the first sidewall of the first stack of conductive strips is offset from the second stack of cells including the second cell 220 on the second sidewall of the first stack of conductive strips, in a direction (X-direction) along which the conductive strips in the first stack of conductive strips extend.

The offset is such that the first vertical conductive line in the first stack of cells (e.g. D within the oval for 210) is disposed between the first vertical conductive line and the second vertical conductive line in the second stack of cells (e.g. D and S within the oval for 220), in the direction along which the conductive strips in the first stack of conductive strips extend.

Also, the offset is such that the second vertical conductive line in the second stack of cells (e.g. S within the oval for 220) is disposed between the first vertical conductive line and the second vertical conductive line in the first stack of cells (e.g. D and S within the oval for 210), in the direction) along which the conductive strips in the first stack of conductive strips extend.

As a result, the input lines and output lines for cells 210 and 220, and other similar pairs of cells in the array, are interleaved, and the cell density can be increased.

Figure 2A:
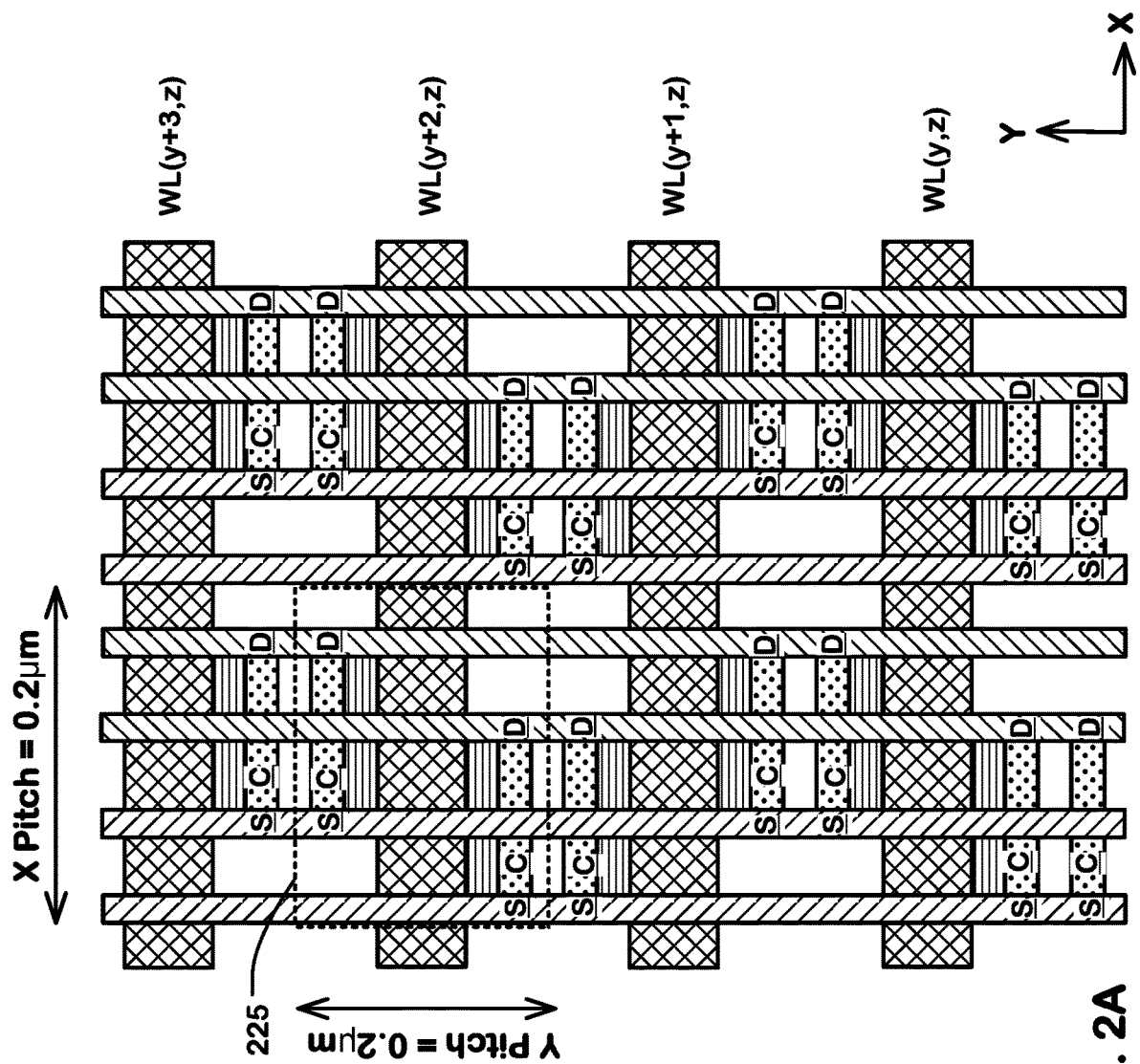
FIG. 2A illustrates an example design rule for the example 3D device illustrated in FIG. 1.

FIG. 2A illustrates an example design rule for 2 stacks of conductive strips (e.g. 225) of the example 3D device illustrated in FIG. 1. The example design rule includes a two-stack gate line X-pitch of 0.2 µm (micrometer) in a first direction (e.g. the X-direction) along which the gate lines extend, and a two-stack source line Y-pitch of 0.2 µm in a second direction (e.g. the Y-direction) orthogonal to the first direction.

Figure 3:
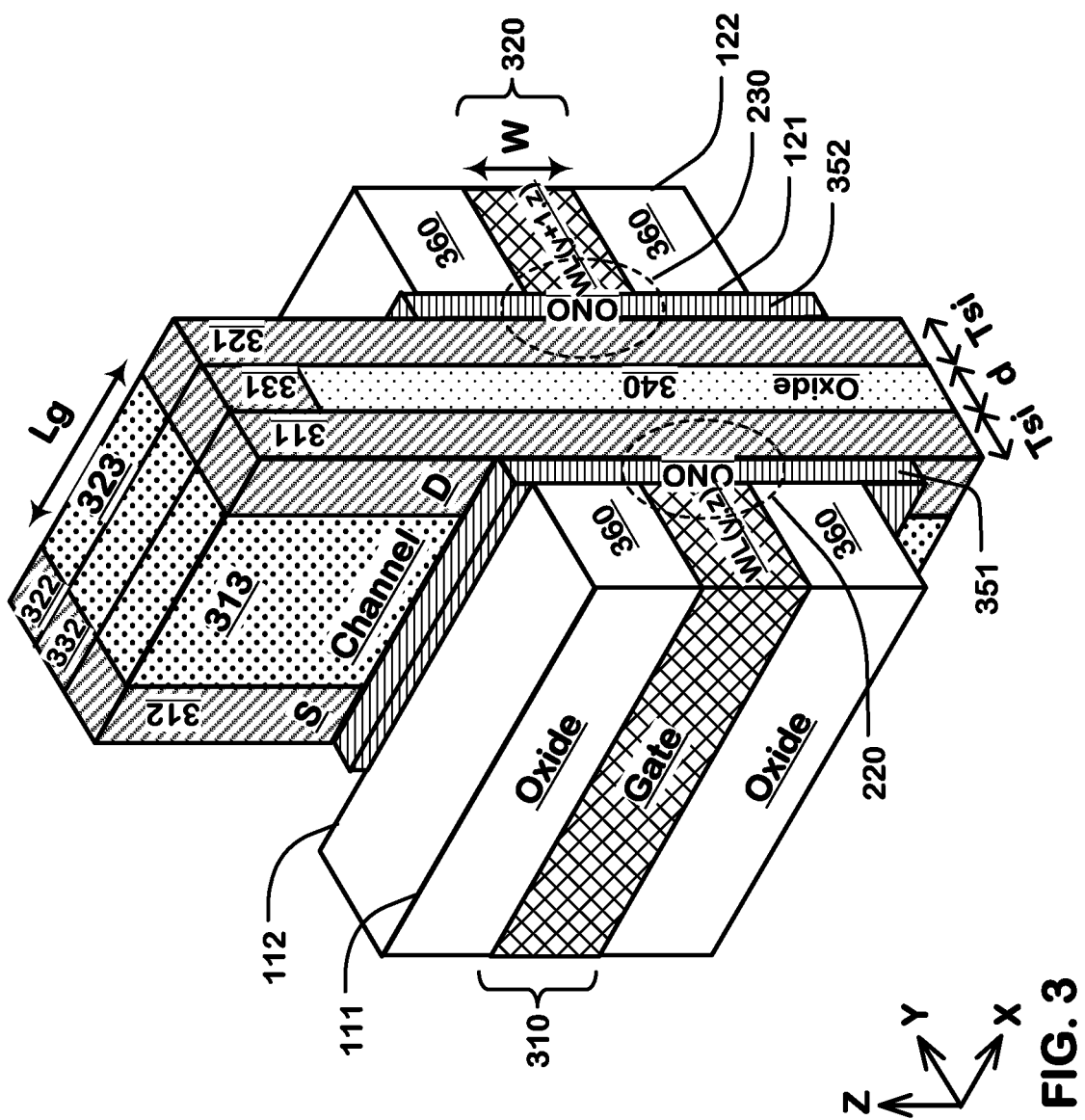
FIG. 3 illustrates an enlarged view of cells in two adjacent stacks of cells disposed on sidewalls of a trench or opening between the adjacent stacks of cells.

FIG. 3 illustrates an enlarged view of cells in two adjacent stacks of cells disposed on sidewalls of a trench or opening between the adjacent stacks of cells.

A first gate line is provided by a conductive strip 310 in a first stack of conductive strips 110 (FIG. 1). The conductive strip 310 has a first sidewall 111 and a second sidewall 112 facing charge storage structure 351, where the second sidewall 112 is opposite the first sidewall 111. A second gate line is provided by a conductive strip 320 in a second stack of conductive strips 120 (FIG. 1). The conductive strip 320 has a first sidewall 121 facing charge storage structure 352 and a second sidewall 122 opposite the first sidewall 121. Conductive strips in the plurality of stacks of conductive strips are separated by insulating strips (360).

Charge storage structure 351 is disposed on the second sidewall 112 of the first stack of conductive strips 110, and charge storage structure 352 is disposed on the first sidewall 121 of the second stack of conductive strips 120. The charge storage structures can include multilayer dielectric charge trapping structures (e.g. Oxide/Nitride/Oxide layers), such as used in SONOS, BE-SONOS, TANOS, MA BE-SONOS and other charge trapping memory devices.

Vertical semiconductor strips are disposed vertically in contact with the charge storage structures (351, 352) on the first and second sidewalls of the conductive strips. The semiconductor strips having first conductively doped regions, configured as the first vertical conductive lines (311, 321), second conductively doped regions, configured as the second vertical conductive lines (312, 322), and a third region (313, 323) between the first and second conductively doped regions having a doping profile of channels of the cells in the stack of cells. As used herein, cells in a 3D array of cells each comprise a transistor, where the transistor includes charge storage structure (e.g. 351), a semiconductor strip having the first conductively doped regions (e.g. 311, 312, 313), and a gate in a conductive strip (e.g. 310).

Cell 220 and other cells in the second stack of cells have first current-carrying terminals (source/drain terminals) in the first vertical conductive line 311, second current-carrying terminals (source/drain terminals) in the second vertical conductive line 312, horizontal channels in the third region 313, and a gate in the conductive strip 310 in the first stack of conductive strips 110.

Cell 230 and other cells in the third stack of cells have first current-carrying terminals in the first vertical conductive line 321, second current-carrying terminals in the second vertical conductive line 322, a horizontal channel in the third region 323, and a gate in the conductive strip 320 in the second stack of conductive strips 120.

Isolation structures are disposed between the vertical semiconductor strips in the plurality of semiconductor strips. For example, an isolation structure 340 is disposed between a first semiconductor strip on the second sidewall 112 of the first stack of conductive strips including the conductive strip 310, and a second semiconductor strip on the first sidewall 121 of the second stack of conductive strips including the conductive strip 320. The first semiconductor strip has a first conductively doped region configured as a first vertical conductive lines 311, a second conductively doped region configured as a second vertical conductive lines 312, and a third region 313 between the first and second conductively doped regions. The second semiconductor strip has a first conductively doped region configured as a first vertical conductive lines 321, a second conductively doped region configured as a second vertical conductive lines 322, and a third region 323 between the first and second conductively doped regions.

A first conductive element 331 can be disposed at the top of the vertical semiconductor strips to connect the first vertical conductive line 311 in the first stack of cells and the first vertical conductive line 321 in the second stack of cells, and provide a landing area for interlayer connectors to overlying metal lines. A second conductive element 332 can be disposed at the top of the vertical semiconductor strips to connect the second vertical conductive line 312 in the first stack of cells and the second vertical conductive line 322 in the second stack of cells, and provide a landing area for interlayer connectors to overlying metal lines.

First interlayer connectors (e.g. 191, FIG. 1) can connect the input lines (e.g. BLodd(2), FIG. 1) to respective first conductive elements (e.g. 331, FIG. 3). Second interlayer connectors (e.g. 192, FIG. 1) can connect the output lines (e.g. SLodd(2), FIG. 1) to respective second conductive elements (e.g. 332, FIG. 3).

For an example size, the channels of the cells in the third regions (313, 323) of the semiconductor strips can have a channel length Lg of about 100 nm (nanometers), a channel width W of about 30 nm, and a channel thickness Tsi of about 10 nm. The isolation structures 340 can have a thickness d greater than 30 nm. The charge storage structures (e.g. 351, 352) can have a thickness of about 14 nm. Of course, the sizes of the cells can vary, depending on the needs and technologies deployed in a particular embodiment.

Channels of the cells in the third regions (313, 323) of the semiconductor strips can include undoped polysilicon, for example. The vertical conductive lines (e.g. 311, 312, 321, 322) can be diffusion lines which are formed on sidewalls of the semiconductor strips using plasma doping on the sidewalls of the semiconductor strips.

Figure 4:
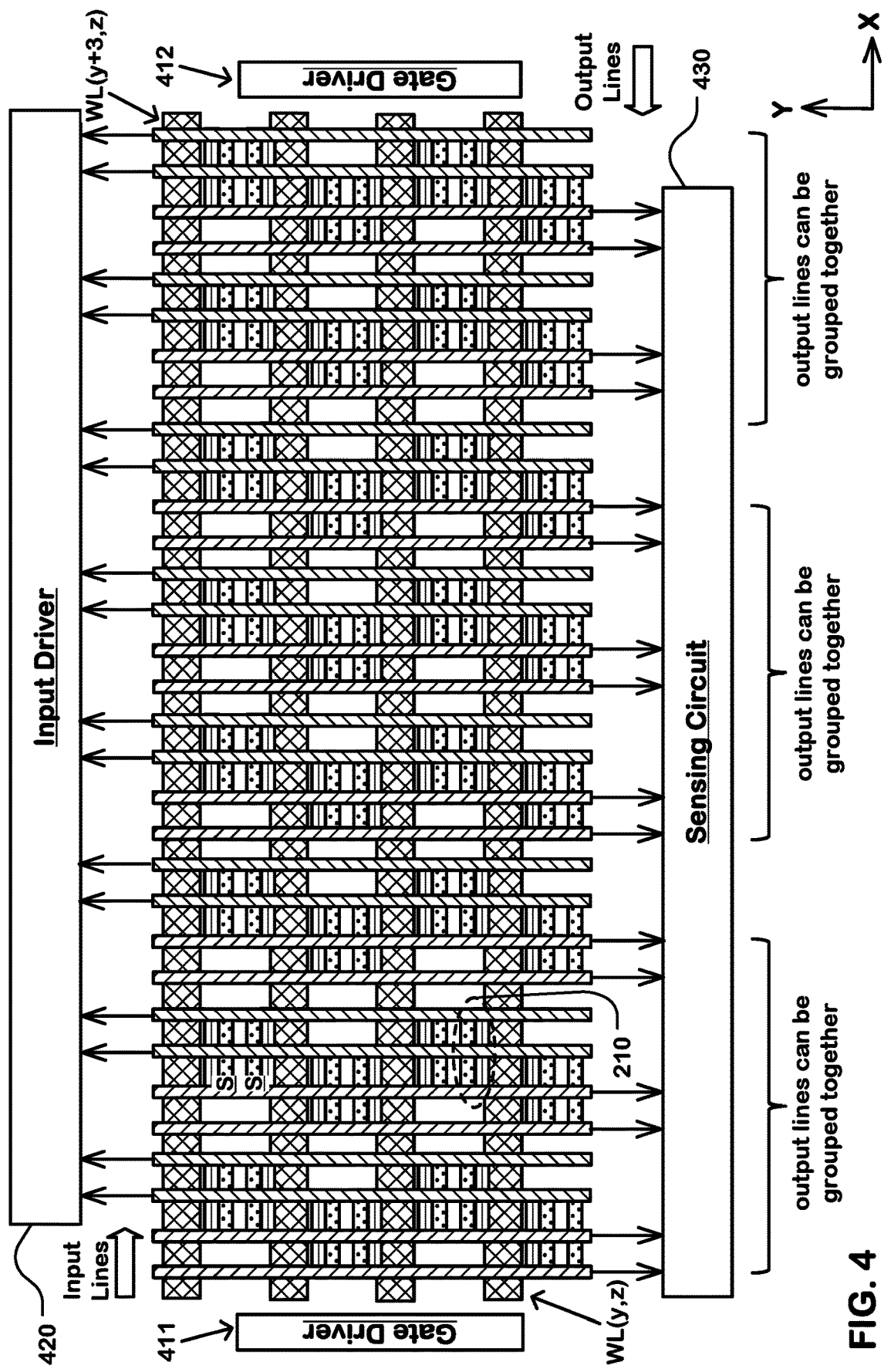
FIG. 4 illustrates a layout view of 64 cells in 4 rows and 16 columns with a sensing circuit coupled to a plurality of output lines.

FIG. 4 illustrates a layout view of 64 cells in 4 rows and 16 columns with a sensing circuit coupled to a plurality of output lines. As illustrated in the example of FIG. 4, gate lines (e.g. WL(y, z), ... WL(y+3, z)) are arranged along the Y rows at a level (z) in the Z levels coupled to the cells 210 in respective rows (e.g. y, ... y+3) in the level (z). A gate driver (e.g. 411, 412) is coupled to the gate lines.

A plurality of input lines (e.g. BLeven(1), BLodd(1), BLeven(2), BLodd(2), FIG. 2) are arranged along the X columns (e.g. x, x+1, x+2, x+3, FIG. 2) and overlying the array of cells and the gate lines. An input driver 420 is coupled to the plurality of input lines which selectively applies voltages to the input lines corresponding to input variables $X_y$. In one embodiment, as many input lines as used to access 8 KB (kilo-bytes) of cells in a device can be implemented on a device, and can operate simultaneously.

A plurality of output lines (e.g. SLeven(1), SLodd(1), SLeven(2), SLodd(2), FIG. 2) is arranged along the X columns (e.g. x, x+1, x+2, x+3, FIG. 2) and overlying the array of cells and the gate lines. Output lines in the plurality of output lines are paired with input lines in respective columns.

A sensing circuit 430 is coupled to the plurality of output lines to sense a sum of currents in a set of output lines (having at least one member) in the plurality of output lines. In one embodiment, an output line is coupled to a plurality of stacks, and the current on the output line can represent a sum of the currents on the plurality of stacks. In another embodiment, output lines in the plurality of output lines can be connected together in groups of output lines. For example, a group can have 8 or 16 output lines connected together. For execution of a sum-of-products operation, the current on the output lines connected together in a group can represent a sum of the currents on the plurality of stacks coupled to the output lines connected together in the group. For execution of a read operation on a single output line in a group of output lines connected together, the single output line can be selected for reading, while other output lines in the group can be grounded.

In the structure described with reference to FIGS. 1-4, the cells in the 3D array are disposed in cross-points of a plurality of vertical lines and a plurality of horizontal lines. The cells have charge storage structures disposed at cross-points of the plurality of vertical lines and the plurality of horizontal lines. One of the plurality of vertical lines and the plurality of horizontal lines can comprise cell body lines, and the other of the plurality of vertical lines and the plurality of horizontal lines can comprise gate lines.

The cell body lines each comprise parallel first and second conductive lines extending along the cell body line, and a plurality of cell bodies at cross-points with gate lines, where the cell bodies are connected between the first and second conductive lines and configured as first and second source/drain terminals and channels of cells in the 3D array. The gate lines each comprise a conductor configured as control gates of cells in the 3D array, adjacent to the charge storage structures at cross-points with the cell body lines.

FIGS. 5-13 illustrate an example process flow for manufacturing a device comprising a 3D array of cells arranged for execution of a sum-of-products operation, like that described above.

Figure 5:
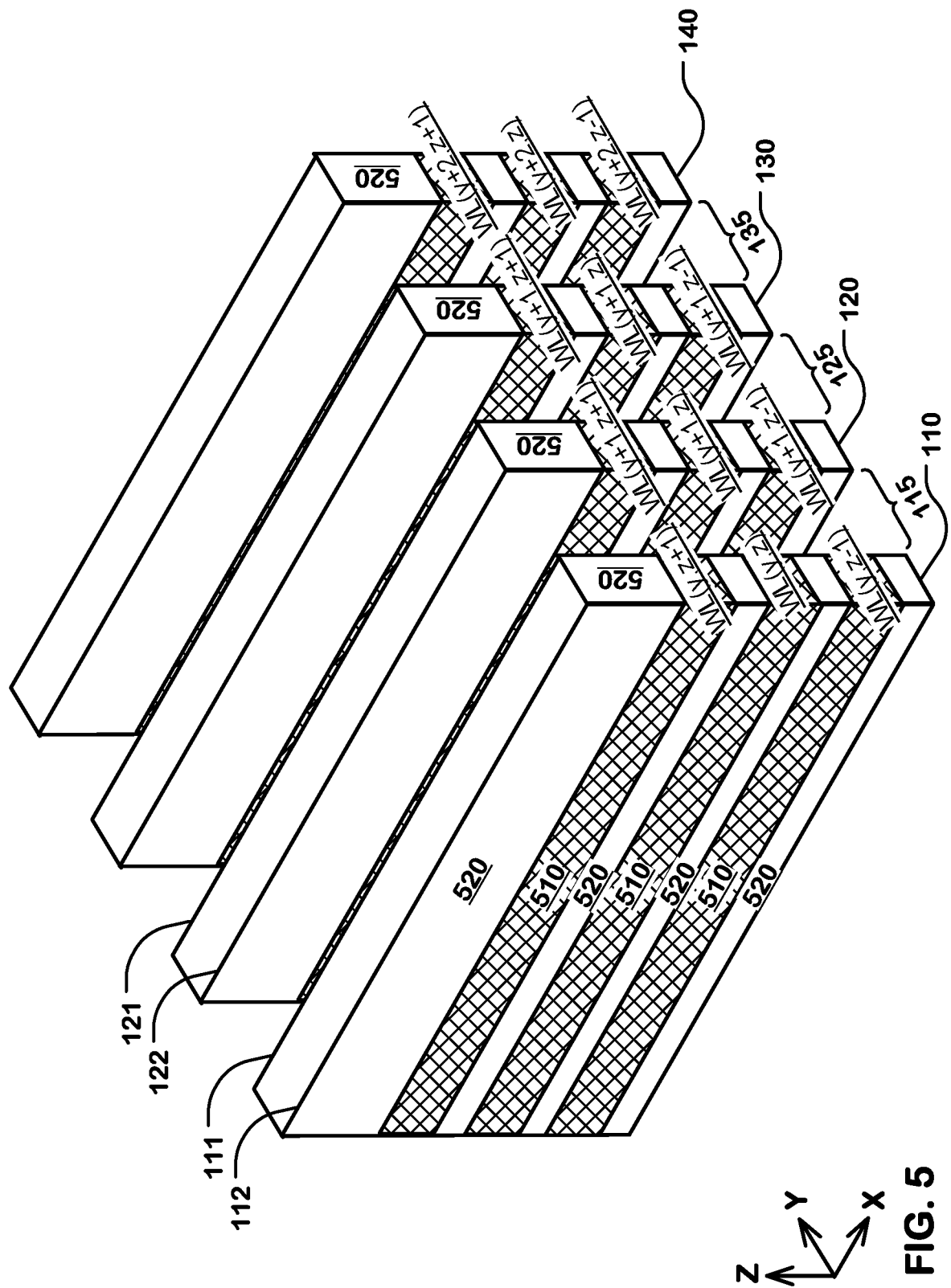
FIGS. 5-13 illustrate an example process flow for manufacturing a device comprising a 3D array of cells arranged for execution of a sum-of-products operation.

FIG. 5 illustrates a stage of the process flow after forming a plurality of stacks of conductive strips (e.g. 110, 120, 130, 140) separated by trenches (e.g. 115, 125, 135). Each of the stacks has a first sidewall and a second sidewall. For example, a first stack of conductive strips 110 has a first sidewall 111 and a second sidewall 112, and a second stack of conductive strips 120 has a first sidewall 121 and a second sidewall 112. The second sidewall 122 of the second stack of conductive strips 120 is opposed to the first sidewall 111 of the first stack of conductive strips 110. Conductive strips 510 in a stack are separated by insulating strips 520.

Conductive strips in the stacks act as gate lines. The gate lines are arranged along the Y rows in corresponding levels of the Z levels. For example, gate lines WL(y, z−1), WL(y, z) and WL(y, z+1) implemented using the conductive strips in the first stack of conductive strips 110 are arranged along a given row (y) in corresponding levels z−1, z and z+1 of the Z levels. For example, gate lines WL(y+1, z−1), WL(y+1, z) and WL(y+1, z+1) implemented using the conductive strips in the second stack of conductive strips 120 are arranged along a given row (y+1) in corresponding levels z−1, z and z+1 of the Z levels.

Figure 6:
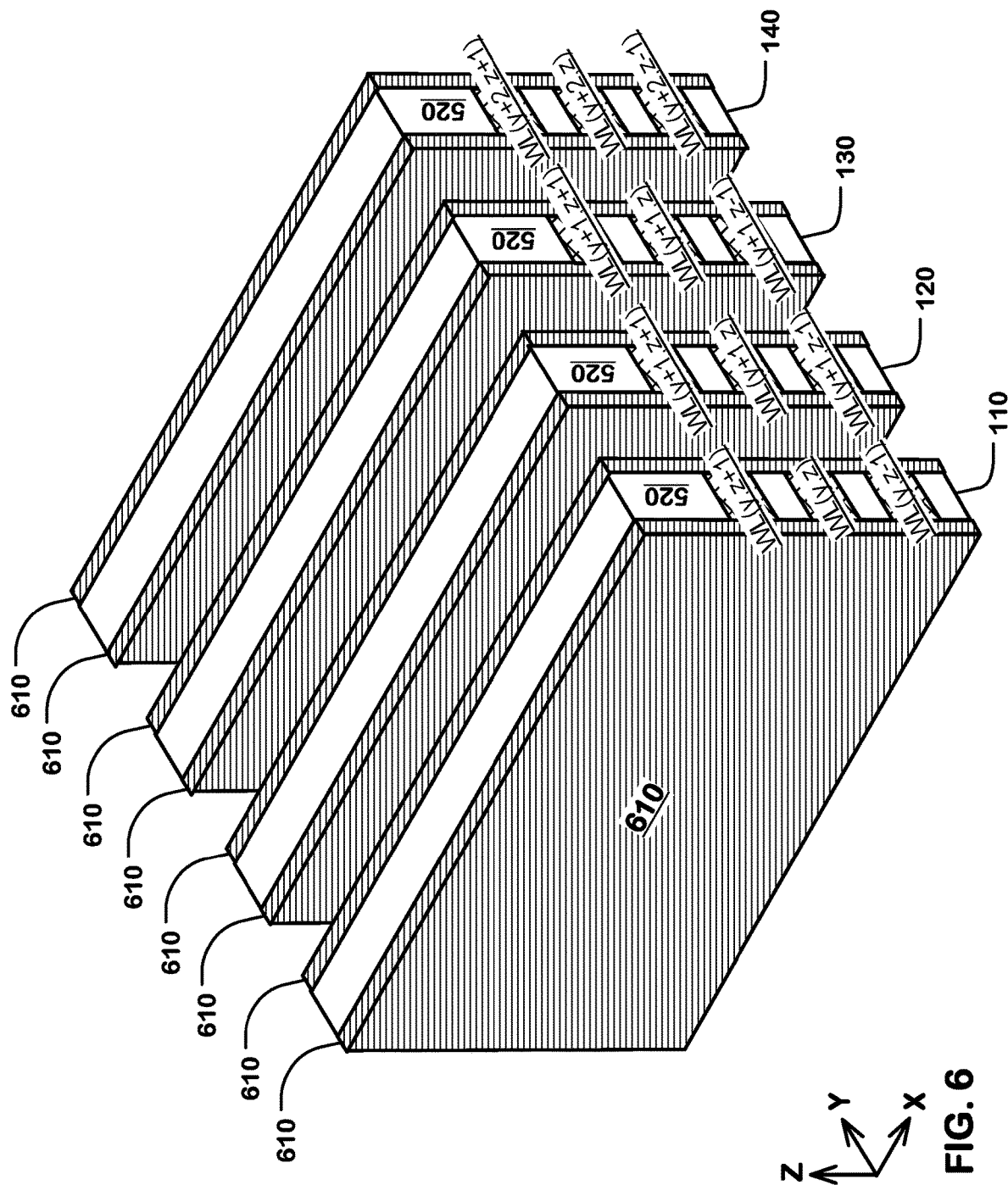

FIG. 6 illustrates a stage of the process flow after forming layers of materials 610 used as charge storage structures on the first and second sidewalls of the stacks of conductive strips (e.g. 110, 120).

Figure 7:
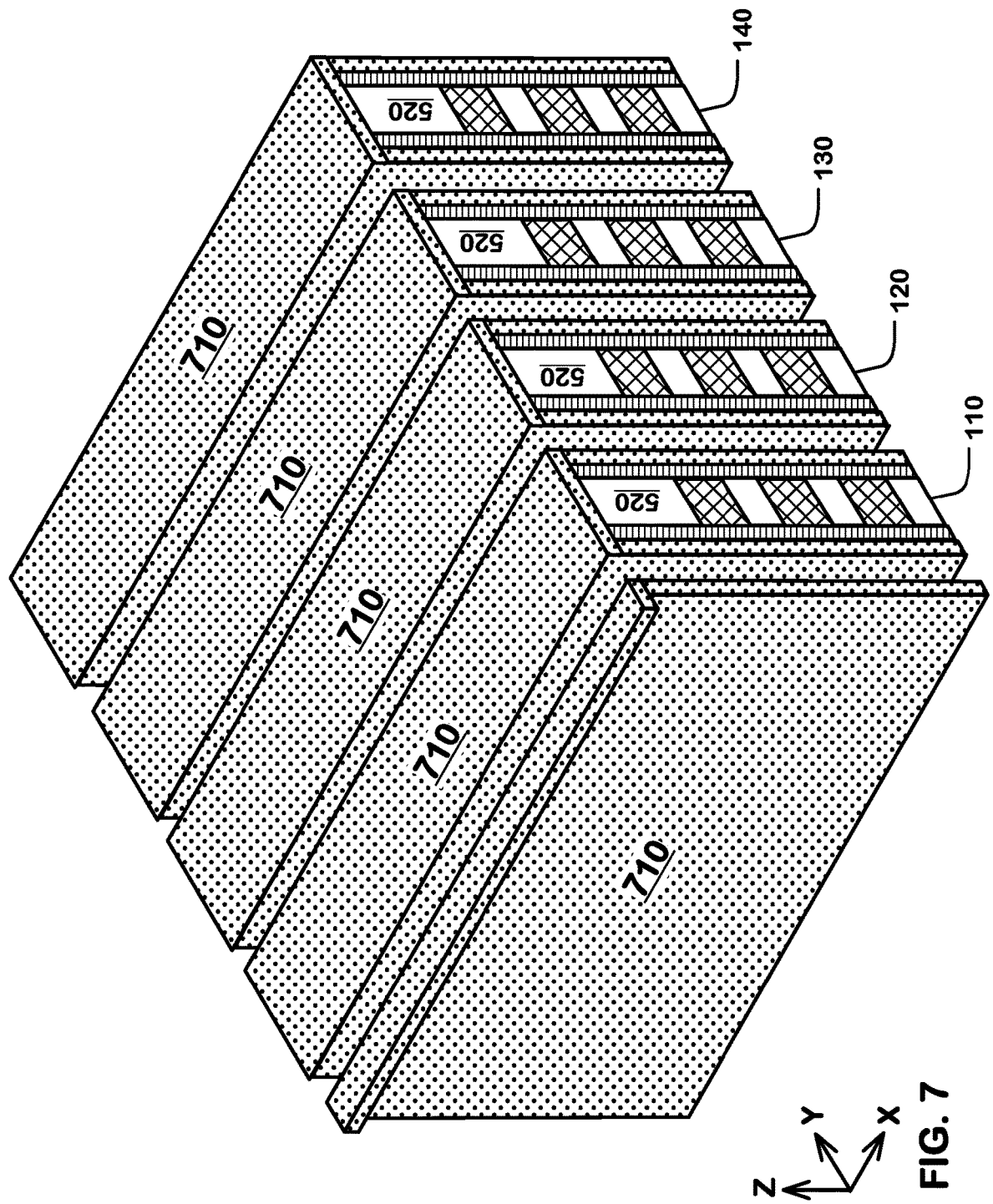
Figure 8:
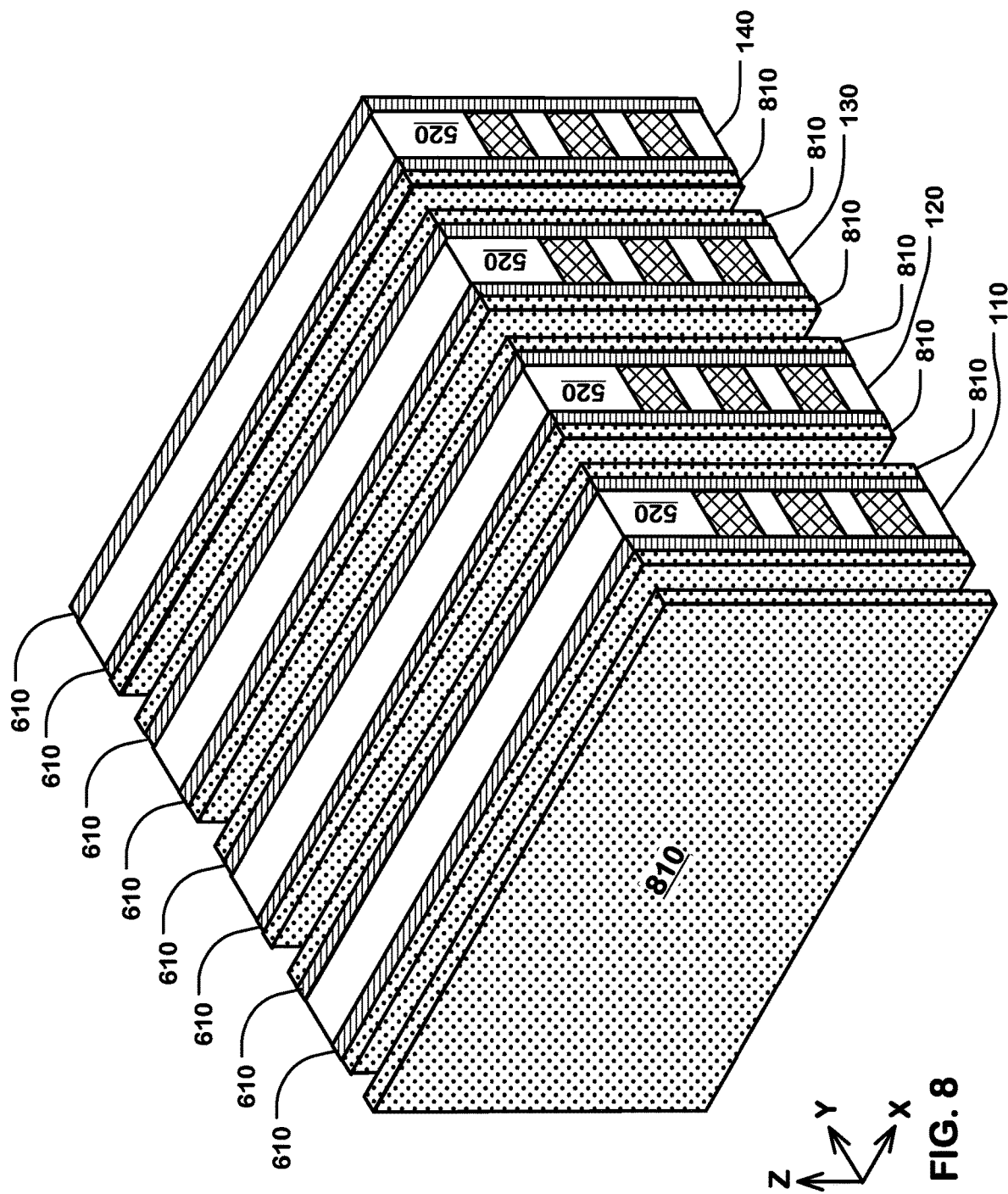

FIGS. 7 and 8 illustrate forming semiconductor films in contact with the layers of materials 610 used as charge storage structures on the first and second sidewalls of the stacks of conductive strips (e.g. 110, 120).

FIG. 7 illustrates a stage of the process flow after forming a layer of semiconductor material 710 on the layers of materials 610 used as charge storage structures on the first and second sidewalls of the stacks of conductive strips and on top surfaces of the stacks of conductive strips (e.g. 110, 120). The layer of semiconductor material can be undoped and conformal to the charge storage structures.

FIG. 8 illustrates a stage of the process flow after removing the layer of semiconductor material 710 on the top surfaces of the stacks of conductive strips (e.g. 110, 120) and in the bottoms of the trenches to form the semiconductor films 810 on the first and second sidewalls of the stacks of conductive strips, where the semiconductor films are separated from each other. This can be done using a spacer etch, or anisotropic etch process selective for the semiconductor material.

Figure 9:
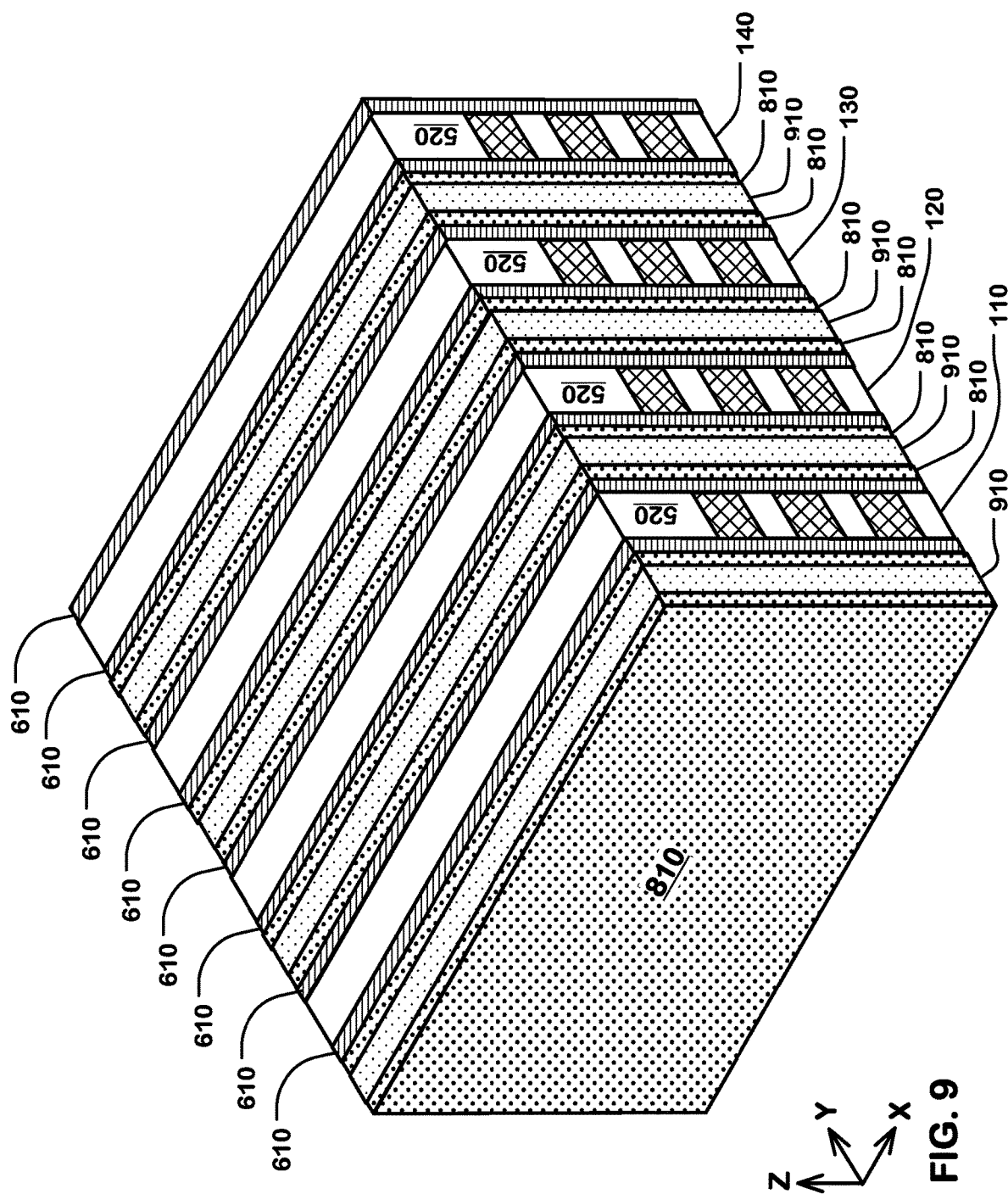

FIG. 9 illustrates a stage of the process flow after filling the trenches with an insulator 910, such as silicon oxide, used for forming isolation structures between the semiconductor films 810 on the first and second sidewalls of the stacks of conductive strips.

Figure 10:
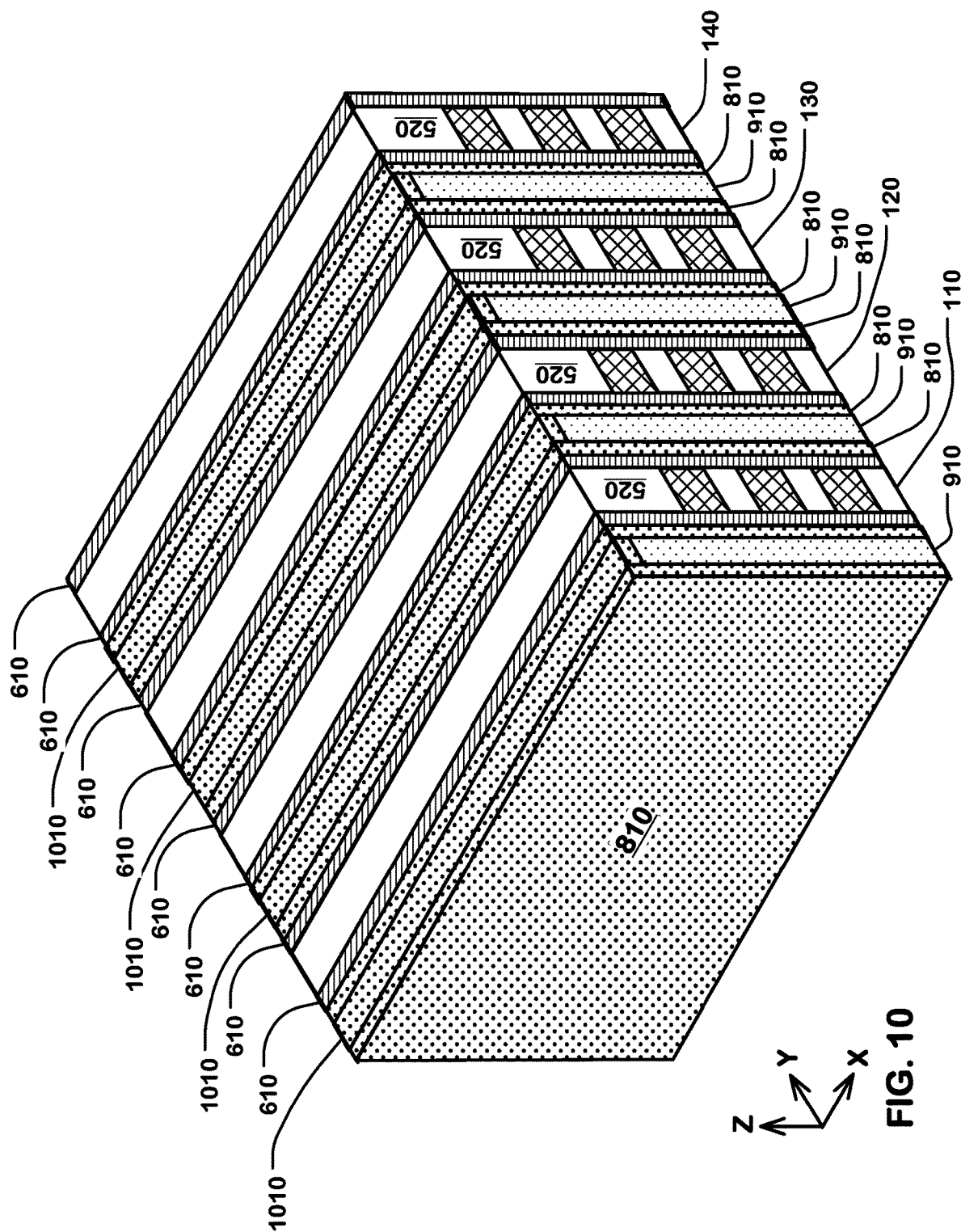

FIG. 10 illustrates a stage of the process flow after etching back the insulator 910, and depositing a semiconductor material 1010 over the insulator 910 in the recesses, and then planarizing the structure. As a result, the semiconductor material 1010 connects the semiconductor films 810 on the first sidewall of a first stack of conductive strips 110 and on the second sidewall of a second stack of conductive strips 120 adjacent the first stack of conductive strips.

Figure 11:
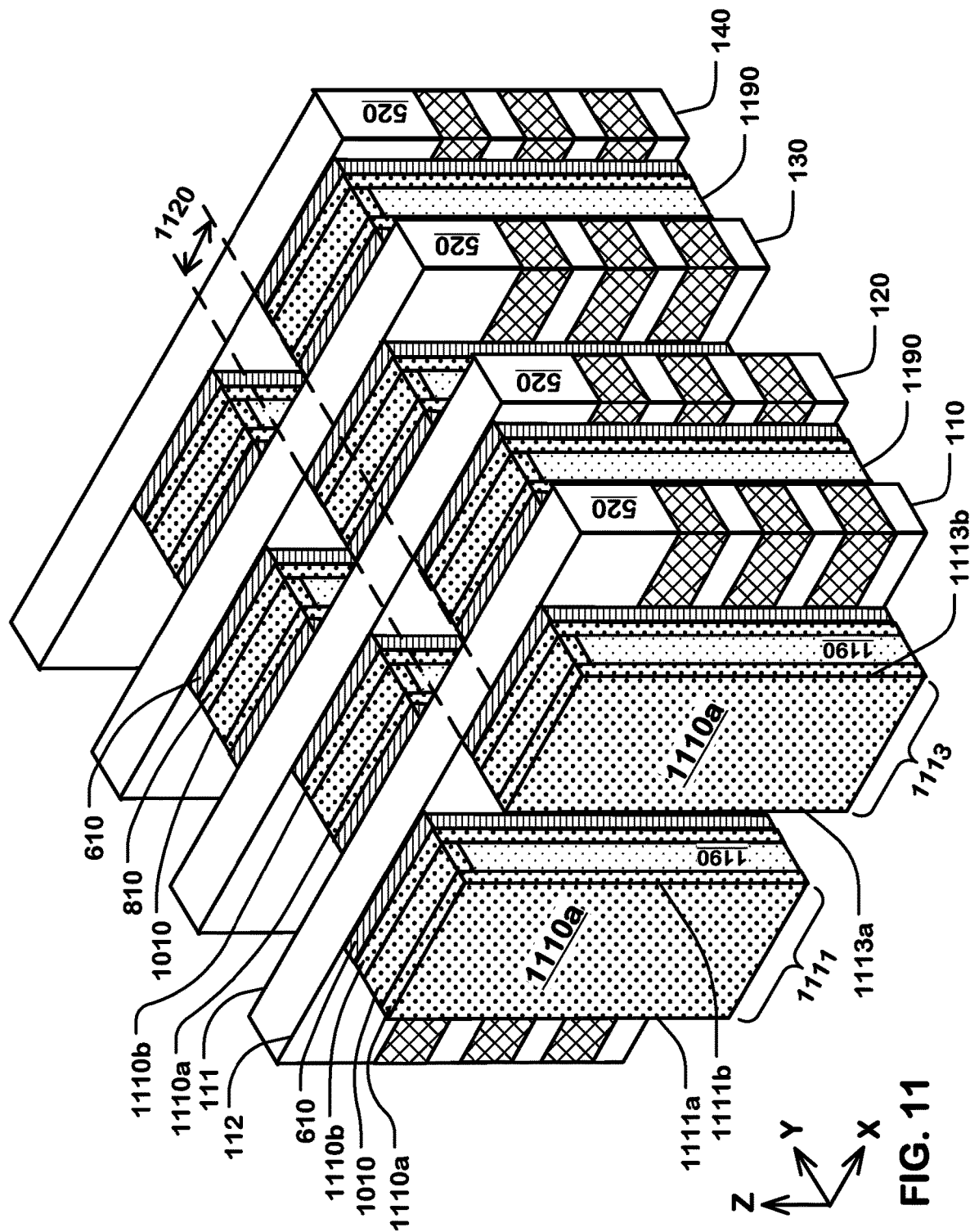

FIG. 11 illustrates a stage of the process flow after etching holes through the layers of materials 610 used as charge storage structures, the semiconductor films 810, the insulator 910, and the semiconductor material 1010 over the insulator 910 to form vertical islands 1111 and 1113 between the first and second stacks of conductive strips. The vertical islands each have first and second semiconductor strips (e.g. 1110a, 1110b) on the first and second stacks of conductive strips, respectively, and a first sidewall and a second sidewall opposite the first sidewall in a direction (e.g. the X-direction) along which the conductive strips in the first and second stacks of conductive strips extend. At this stage, the insulator 910 (FIG. 10) is etched to form isolation structures 1190.

As shown in the example of FIG. 11, a first island has a first sidewall 1111a and a second sidewall 1111b opposite the first sidewall in the X-direction. A second island 1113 has a first sidewall 1113a and a second sidewall 1113b opposite the first sidewall in the X-direction. The layers of materials 610 used as charge storage structures, the semiconductor strips 1110a and 1110b, isolation structures 1190, and the semiconductor material 1010 over the isolation structure are exposed through the holes on the first and second sidewalls.

Islands on the first sidewall 111 of the first stack of conductive strips 110 are offset (e.g. 1120) from the islands on the second sidewall 112 of the first stack of conductive strips in a direction along which the conductive strips in the first stack of conductive strips extend.

Figure 12:
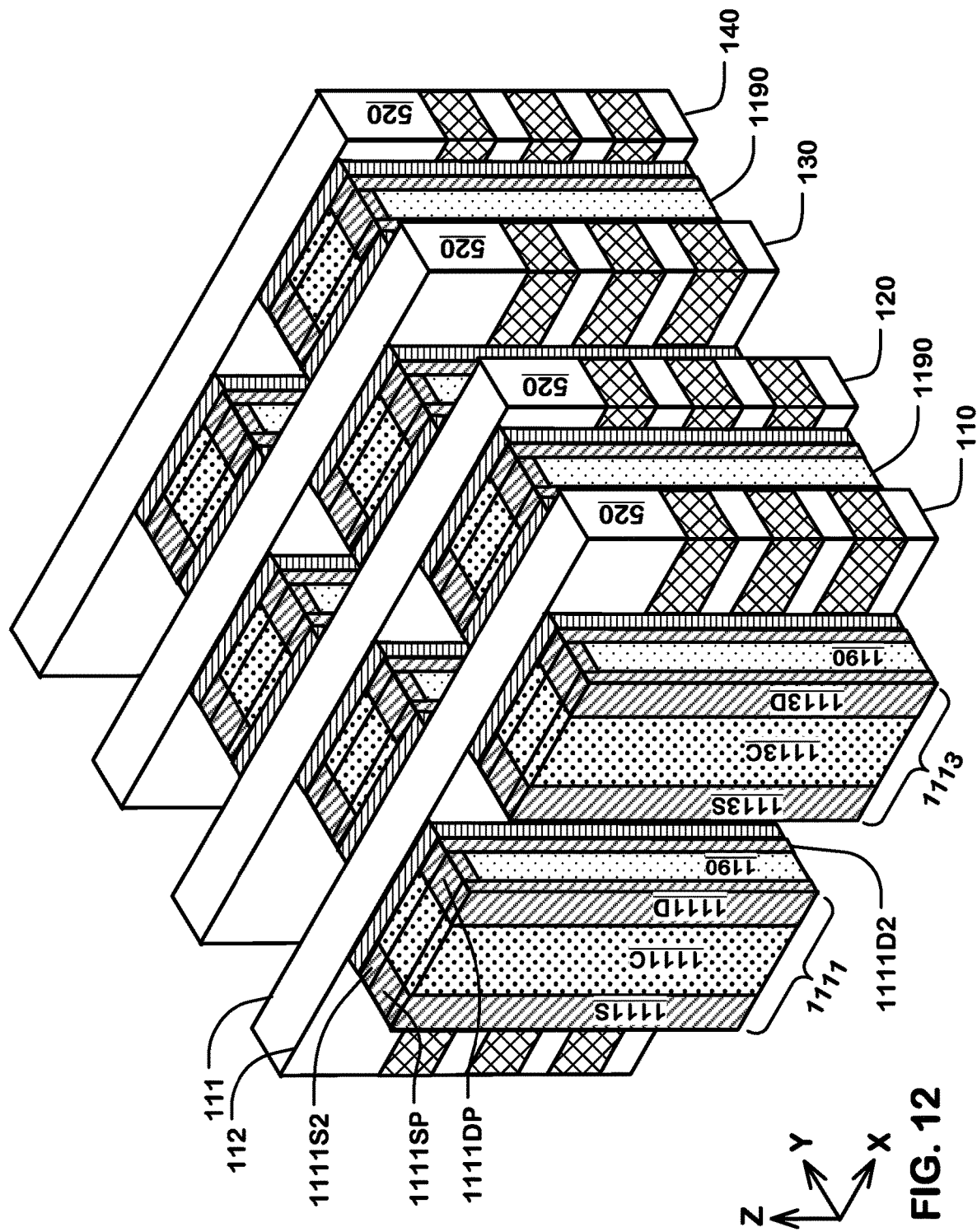

FIG. 12 illustrates a stage of the process flow after doping the first and second semiconductor strips (e.g. 1110a, 1110b, FIG. 11) on the first and second sidewalls (e.g. 1111a and 1111b, 1113a and 1113b, FIG. 11) of the islands exposed through the holes to form a first conductively doped region configured as the first conductive line (e.g. 1111D, 1113D), a second conductively doped region configured as the second conductive line (e.g. 1111S, 1113S), and a third region (e.g. 1111C, 1113C) between the first and second conductively doped regions having a doping profile of the channels of the cells in the 3D array.

In one embodiment, the first and second conductive lines can include N+ diffusion formation as a result of the doping process. In an alternative embodiment, the first and second conductive lines can include P+ diffusion formation as a result of the doping process. Cells in the 3D array have first current-carrying terminals in the first conductive line, second current-carrying terminals in the second conductive line, the channels in the third region of the semiconductor strips, and gates in the conductive strips in the plurality of stacks of conductive strips.

This stage of the process flow includes doping the semiconductor material over the isolation structure on the first and second sidewalls of the islands. This doping step can form a first conductive element 1111DP connecting the first conductive line 1111D on the first sidewall of the first stack of conductive strips and the first conductive line 1111D2 on the second sidewall of the second stack of conductive strips, and a second conductive element 1111SP connecting the second conductive lines 1111S on the first sidewall of the first stack of conductive strips and the second conductive lines 1111S2 on the second sidewall of the second stack of conductive strips.

Figure 13:
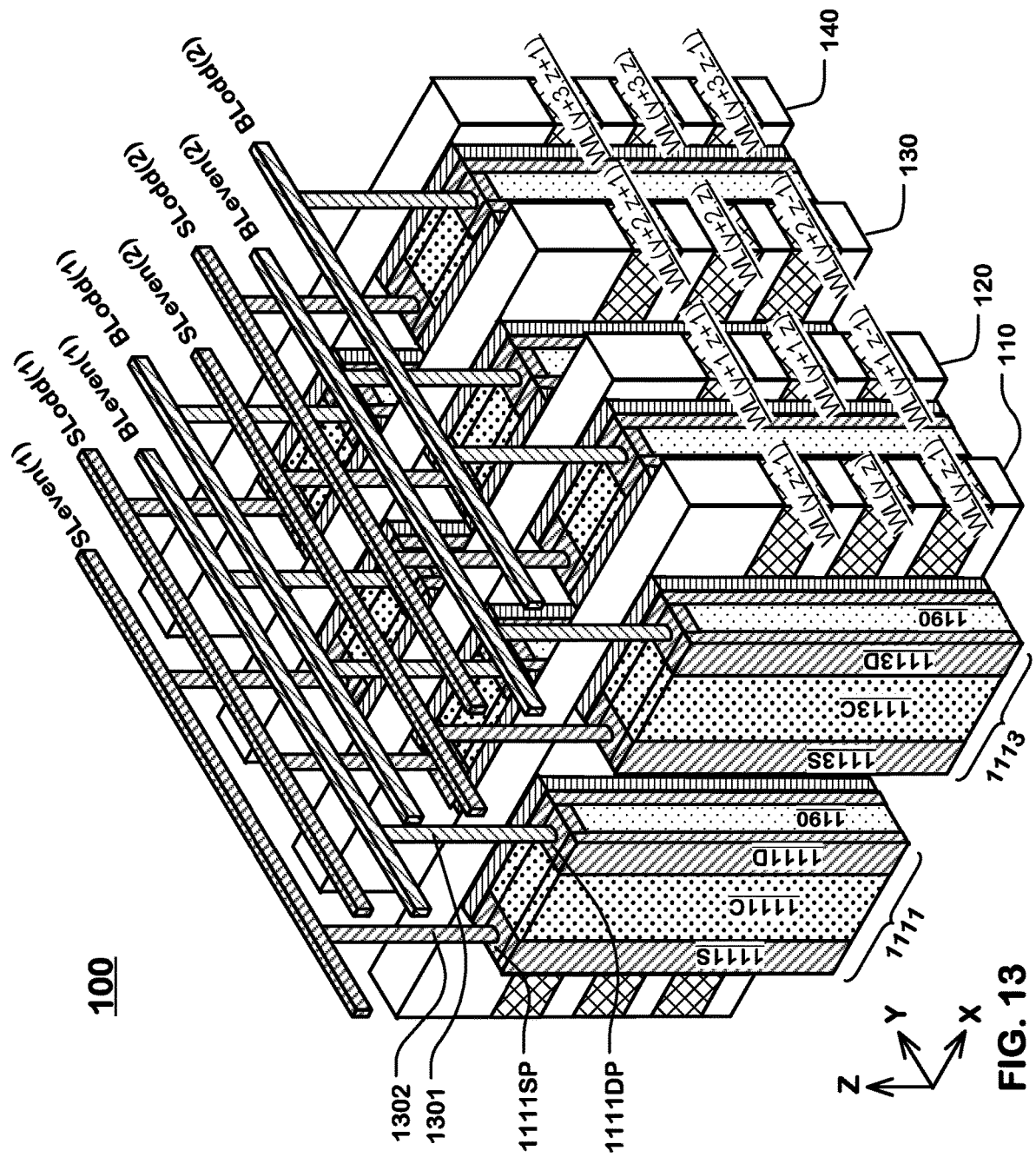

FIG. 13 illustrates a stage of the process flow after forming a plurality of input lines (e.g. BLeven(1)) connected to the first conductive lines (e.g. 1111D, 1113D) in the semiconductor strips (e.g. 1110a, 1110b) on the stacks of conductive strips, and a plurality of output lines (e.g. SLeven(1)) connected to the second conductive lines (e.g. 1111S, 1113S) in the semiconductor strips (e.g. 1110a, 1110b) on the stacks of conductive strips. At this stage, first interlayer connectors (e.g. 1301) are formed connecting the input lines (e.g. BLeven(1)) to respective first conductive elements (e.g. 1111DP). Second interlayer connectors (e.g. 1302) are formed connecting the output lines (e.g. SLeven(1)) to respective second conductive elements (e.g. 1111SP). Then, patterned conductor layers are formed that include the input lines (bit lines) and the output lines (source lines).

Figure 14A:
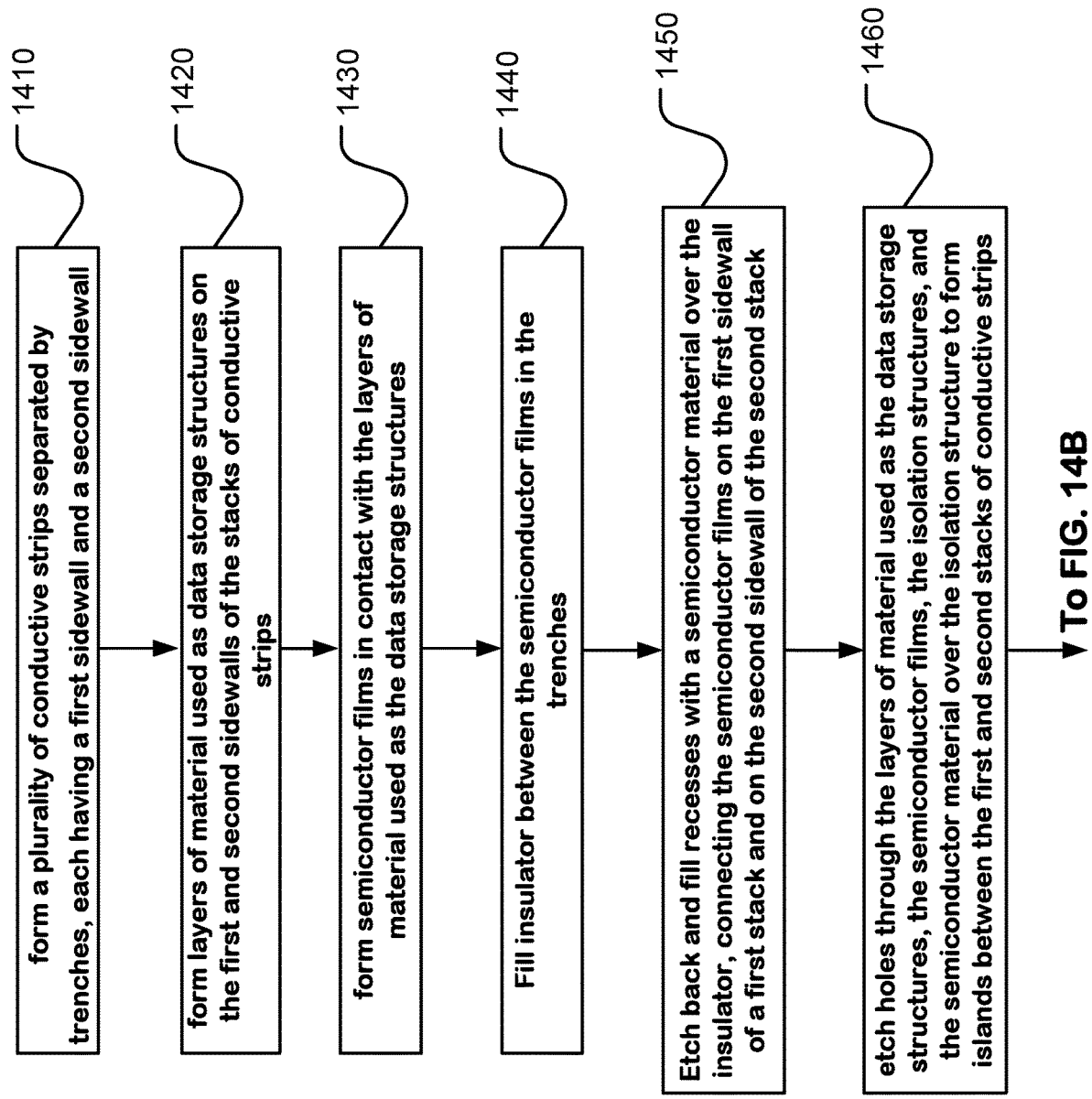
FIGS. 14A and 14B illustrate a flowchart for an example process flow for manufacturing a device comprising a 3D array of cells arranged for execution of a sum-of-products operation.
Figure 14B:
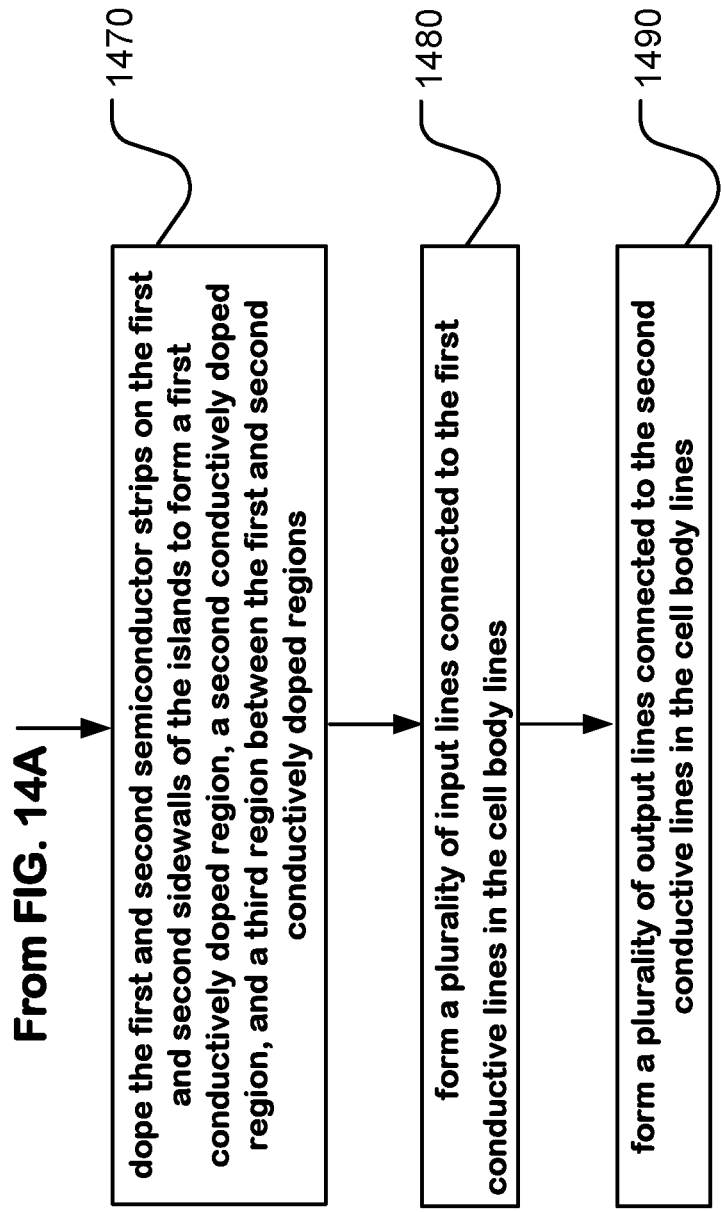

FIGS. 14A and 14B illustrate a flowchart for an example process flow for manufacturing a device comprising a 3D array of cells arranged for execution of a sum-of-products operation, as described with reference to FIGS. 5 to 13.

At Step 1410, a plurality of stacks of conductive strips to be used as gate lines, separated by trenches, are formed, each of the stacks having a first sidewall and a second sidewall. This step is further described in reference to FIG. 5.

At Step 1420, layers of material used as charge storage structures are formed on the first and second sidewalls of the stacks of conductive strips. This step is further described in reference to FIG. 6.

At Step 1430, semiconductor films are formed in contact with the layers of material used as the charge storage structures on the first and second sidewalls of the stacks of conductive strips. This step is further described in reference to FIGS. 7-8.

At Step 1440, insulators are formed between the semiconductor films. This step is further described in reference to FIG. 9.

At Step 1450, the insulator is etched back to form recesses, a semiconductor material is deposited in the recesses over the insulator structure. The semiconductor material in the recesses forms landing areas and connects the semiconductor films on the first sidewall of a first stack of conductive strips and on the second sidewall of a second stack of conductive strips adjacent the first stack of conductive strips. This step is further described in reference to FIG. 10.

At Step 1460, holes are etched through the layers of material used as the charge storage structures, the semiconductor films, the isolation structures, and the semiconductor material over the isolation structure to form islands between the first and second stacks of conductive strips, the islands each having first and second semiconductor strips on the first and second stacks of conductive strips, respectively, a first sidewall and a second sidewall opposite the first sidewall in a direction along which the conductive strips in the first and second stacks of conductive strips extend. This step is further described in reference to FIG. 11.

At Step 1470, the first and second semiconductor films on the first and second sidewalls of the islands are doped though the holes to form a first conductively doped region configured as the first conductive line, a second conductively doped region configured as the second conductive line, and a third region between the first and second conductively doped regions having a doping profile of the channels of the cells in the 3D array. This step is further described in reference to FIG. 12.

At Step 1480, a plurality of input lines is formed that is connected to the first conductive lines in the cell body lines. This step is further described in reference to FIG. 13.

At Step 1490, a plurality of output lines is formed that is connected to the second conductive lines in the cell body lines. This step is further described in reference to FIG. 13.

The process flow can further form a gate driver (e.g. 1940, FIG. 19) coupled to the horizontal conductive strips, which act as gate lines, in a contact area adjacent the array. The gate driver selectively applies control gate voltages which in combination with the charge in the charge storage structures of the cells corresponds to weights $W_{wyz}$ of terms in the sum-of-products operation, in response to address signals to select cells in the 3D array as terms in the sum-of-products operation.

The process flow can further form an input driver (e.g. 1970, FIG. 19) coupled to the plurality of input lines which selectively applies voltages corresponding to input variables $X_y$, and a sensing circuit (e.g. 1950, FIG. 19) coupled to the plurality of output lines to sense a sum of currents in a set of output lines in the plurality of output lines.

FIGS. 15-18 illustrate example sum-of-products operations, and memory operations including read, program and erase operations, in reference to an example 3D array of cells usable as memory or to read status of the cells in the array configured for sum-of-products operations. An example 3D array of cells is described in reference to FIGS. 1-4. As used herein, for memory operations, an input line (e.g. BLeven(1)) can be referred to as a bit line, an output line (e.g. SLeven(1)) can be referred to as a source line, and a gate line (e.g. WL(y,z)) can be referred to as a word line.

Figure 15:
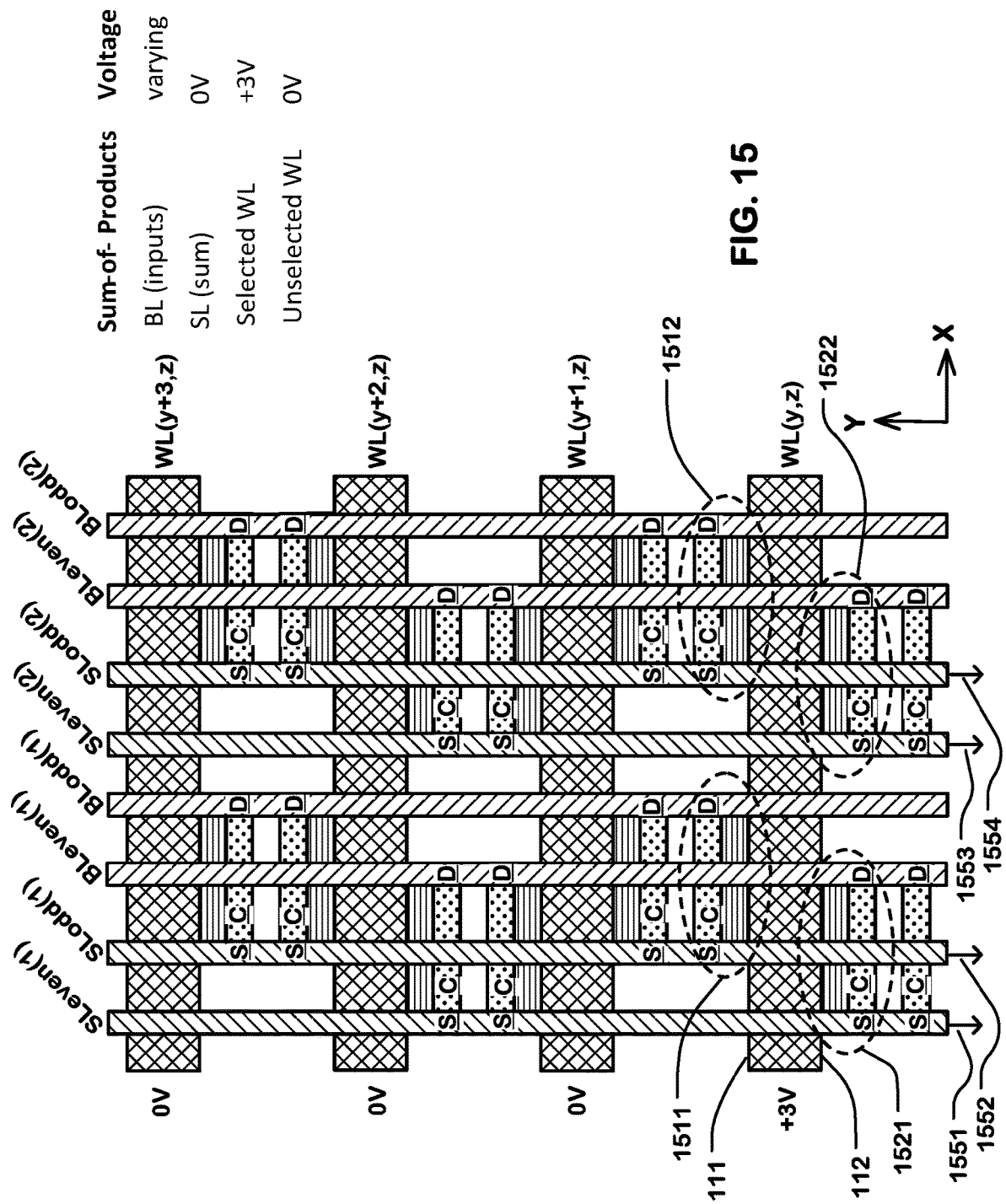
FIG. 15 illustrates an example sum-of-products operation in reference to an example 3D array of cells usable as memory or to read status of the cells in the array configured for sum-of-products operations.

FIG. 15 illustrates an example sum-of-products operation in reference to an example 3D array of cells usable as memory or to read status of the cells in the array configured for sum-of-products operations. A selected cell 1521 has its first current-carrying terminal D coupled to a selected bit line BLeven(1), its second current-carrying terminal S coupled to a selected source line SLeven(1), and its gate coupled to a selected word line WL(y, z). A sum-of-products operation executes the following equation:

$$Sum = \sum_{x=1}^{X} V_{BL_{(x)}} * W(x, y, z)$$

where $V_{BL(x)}$ represents voltage applied to an input line on a column (x), and is also referred to as input X(x) herein. W(x, y, z) represents a weight factor of a cell in the array of cells at column (x), row (y) and level (z). Sum represents summed current (e.g. 1551, 1552, 1553, 1554) for a group of output lines x=1 to N. In one embodiment, N can be an even number for a sum-of-products operation, such as N=2, 4, 8, 16, 32, etc. In an alternative embodiment, N can be an odd number for a sum-of-products operation, such as N=3, 5, 9, 17, 33, etc.

A sensing circuit 430 (FIG. 4) is coupled to the plurality of output lines to sense a sum of currents in a set of output lines (having at least one member) in the plurality of output lines. In one embodiment, an output line is coupled to a plurality of stacks, and the current on the output line can represent a sum of the currents on the plurality of stacks. In another embodiment, output lines in the plurality of output lines can be connected together in groups of output lines. For example, a group can have 8 or 16 output lines connected together. For execution of a sum-of-products operation, the current on the output lines connected together in a group can represent a sum of the currents on the plurality of stacks coupled to the output lines connected together in the group. For execution of a read operation on a single output line in a group of output lines connected together, the single output line can be selected for reading, while other output lines in the group can be grounded.

As shown in the example of FIG. 15, cells (e.g. 1511, 1512) on a first sidewall (e.g. 111) of a stack of conductive strips at a level (z), and cells (e.g. 1521, 1522) on a second sidewall 112 of the stack of conductive strips at the level (z) are selected by a gate line WL(y,z) in the stack of conductive strips. Output lines SLeven(1), SLodd(1), SLeven(2) and SLodd(2) are coupled to cells 1521, 1511, 1522 and 1512, respectively, and are also coupled to cells on other gate lines (e.g. WL(y+1, z), WL(y+2, z) and WL(y+3, z)).

For execution of a sum-of-products operation, the selected gate line WL(y, z) can be biased at voltage +3V, and the output lines (e.g. SLeven(1), SLodd(1), SLeven(2), SLodd(2)) can be biased at voltage 0V. The input lines (e.g. BLeven(1), BLodd(1), BLeven(2), BLodd(2)) can be biased at a range of voltages (e.g. +0.3V, +0.6V, +0.2V, +0.5V) representing input i(x) (e.g. $V_{BL(x)}$).

Figure 16:
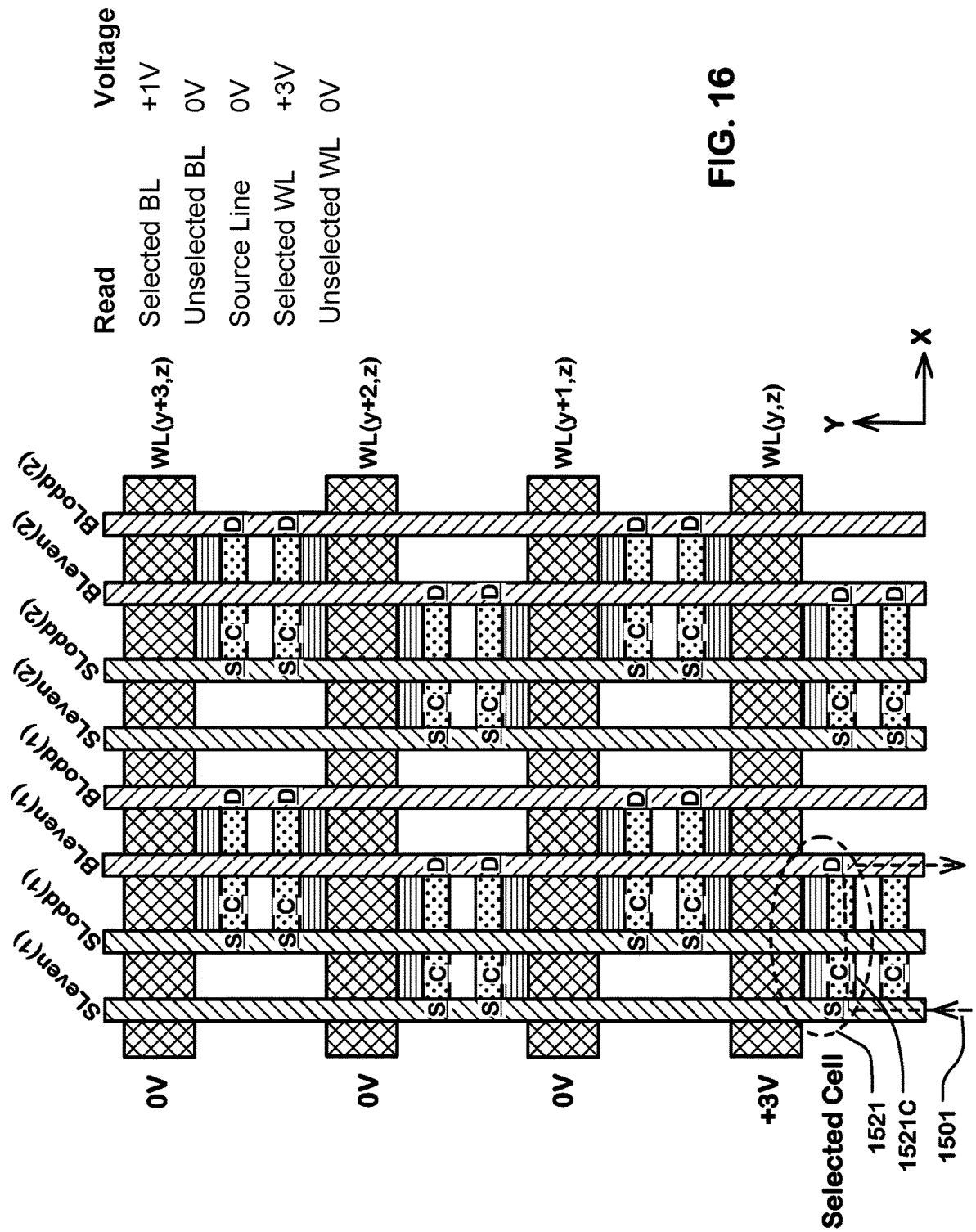
FIG. 16 illustrates an example read operation in reference to an example 3D array of cells usable as memory or to read status of the cells in the array configured for sum-of-products operations.

FIG. 16 illustrates an example read operation in reference to an example 3D array of cells usable as memory or to read status of the cells in the array configured for sum-of-products operations. A selected cell 1521 is as described in reference to FIG. 15.

For execution of a read operation, the selected bit line BLeven(1) can be biased at voltage +1V, while unselected bit lines (e.g. BLodd(1), BLeven(2), BLodd(2)) can be biased at voltage 0V. Source lines (e.g. SLeven(1), SLodd(1), SLeven(2), SLodd(2)) can be biased at voltage 0V. The selected word line WL(y, z) can be biased at voltage +3V, while unselected word lines (e.g. WL(y+1, z), WL(y+2, z), WL(y+3, z)) can be biased at 0V.

Under the given bias conditions, a read current (e.g. 1501) can flow from the selected source line SLeven(1) through the channel (e.g. 1521C) in the selected cell 1521 to the selected bit line BLeven(1).

Figure 17:
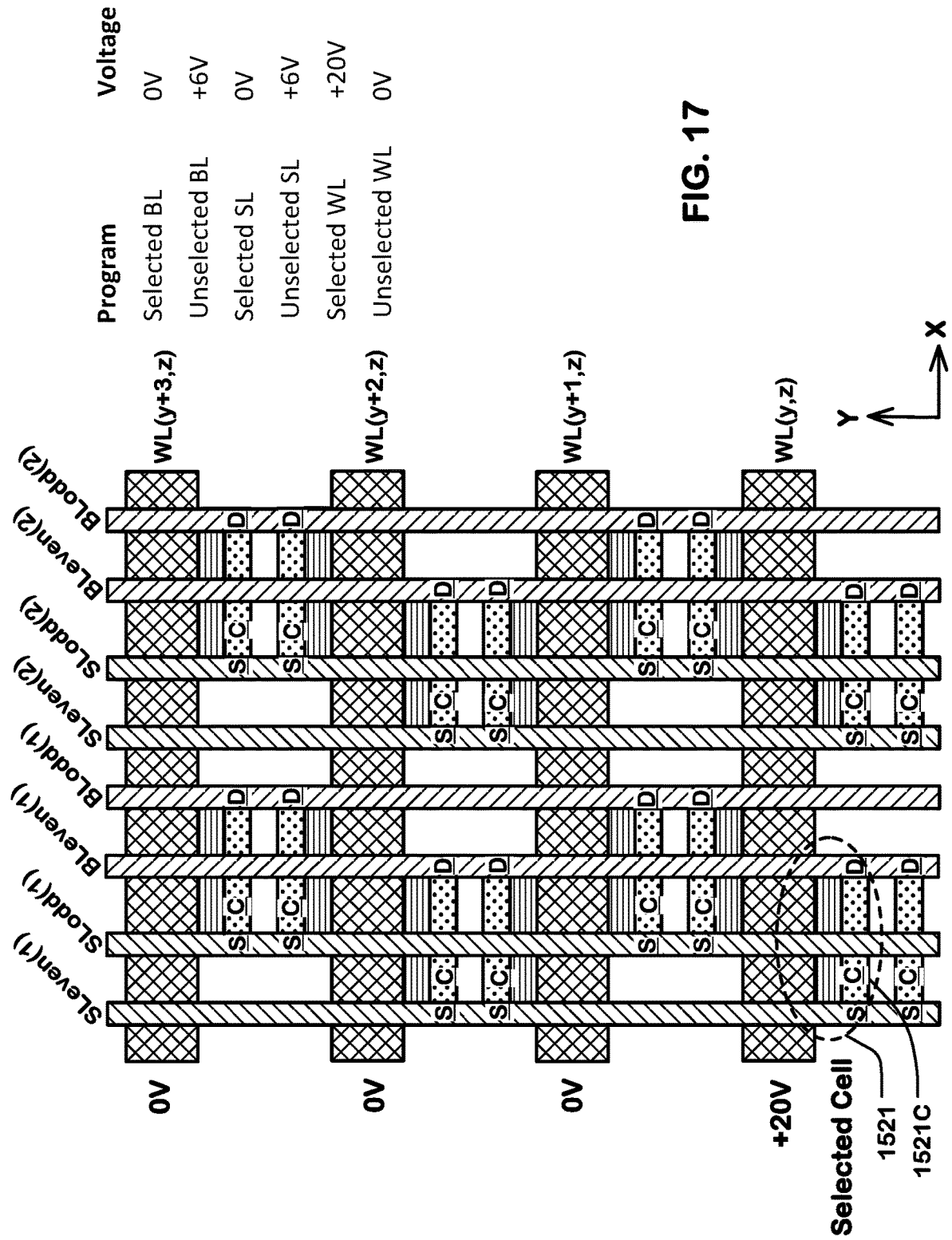
FIG. 17 illustrates an example program operation in reference to an example 3D array of cells usable as memory or to read status of the cells in the array configured for sum-of-products operations.

FIG. 17 illustrates an example program operation in reference to an example 3D array of cells usable as memory or to read status of the cells in the array configured for sum-of-products operations. A selected cell 1521 is as described in reference to FIG. 15.

For execution of a program operation, to induce +FN (Fowler-Nordheim) programming, a selected word line WL(y, z) can be applied a program pulse at voltage +20V, the selected bit line BLeven(1) can be biased at voltage 0V, and the selected source line SLeven(1) can be biased at voltage 0V, which can induce an increase in the threshold voltage of the cell. Unselected word lines (e.g. WL(y+1, z), WL(y+2, z), WL(y+3, z)) can be biased at 0V. Unselected bit lines (e.g. BLodd(1), BLeven(2), BLodd(2)) and unselected source lines (e.g. SLodd(1), SLeven(2), SLodd(2)) can be biased at voltage +6V for inhibit. Incremental step pulse programming ISPP operations can be used. Multilevel, multiple-bit-per-cell programming can be used. Single-bit-per-cell programming can be used.

In one embodiment using the +FN (Fowler-Nordheim) programming, the bit line and source line for the selected cells can be applied a same voltage (e.g. 0V), and the bit line and source line for the unselected cells can be applied a same voltage (e.g. +6V), so there is no current flowing through the channels, and there is no punch-through voltage concern for the device.

Figure 18:
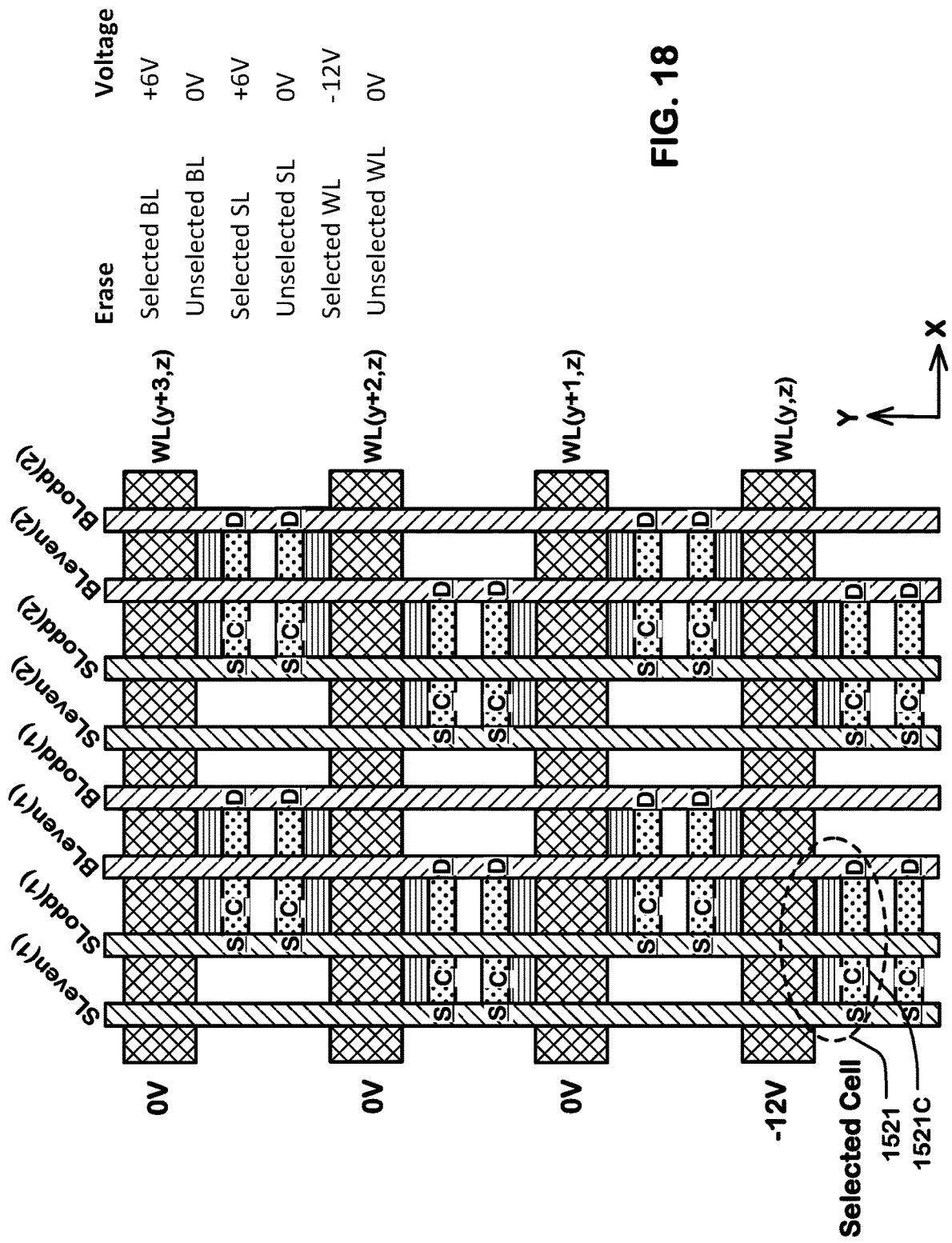
FIG. 18 illustrates an example erase operation in reference to an example 3D array of cells usable as memory or to read status of the cells in the array configured for sum-of-products operations.

FIG. 18 illustrates an example erase operation in reference to an example 3D array of cells usable as memory or to read status of the cells in the array configured for sum-of-products operations. A selected cell 1521 is as described in reference to FIG. 15.

For execution of an erase operation, to induce −FN (Fowler-Nordheim) erasing, the selected word line WL(y, z) can be applied a pulse at voltage −12V, the selected bit line BLeven(1) can be biased at voltage +6V, and the selected source line SLeven(1) can be biased at voltage +6V. Unselected word lines (e.g. WL(y+1, z), WL(y+2, z), WL(y+3, z)) are biased at 0V, unselected bit lines (e.g. BLodd(1), BLeven(2), BLodd(2)) can be biased at voltage 0V, and unselected source lines (e.g. SLodd(1), SLeven(2), SLodd(2)) can be biased at voltage 0V. A variety of erase processes can be utilized.

Figure 19:
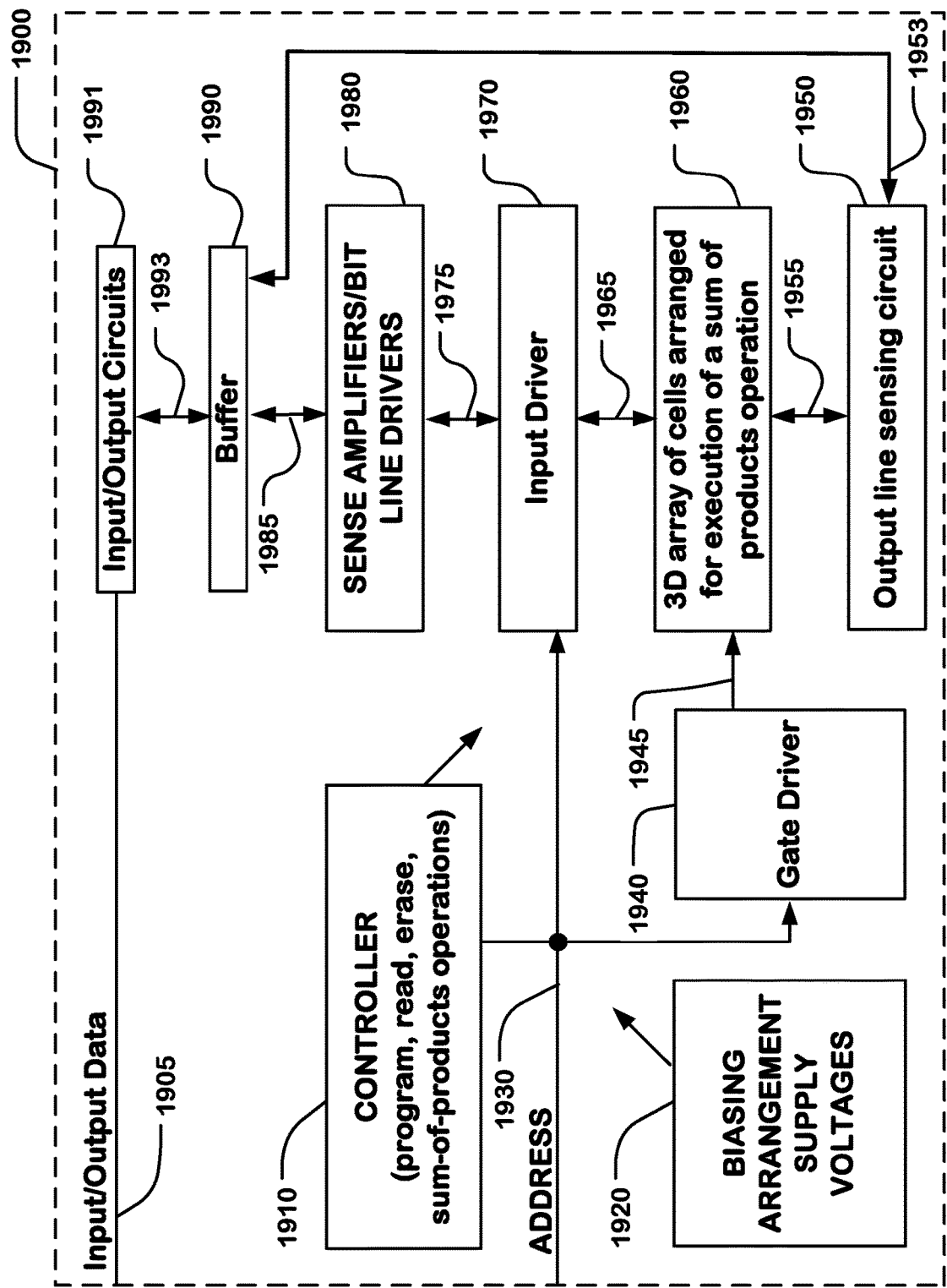
FIG. 19 is a simplified chip block diagram of an integrated circuit device including a 3D array of cells arranged for execution of a sum-of-products operation.

FIG. 19 is a simplified chip block diagram of an integrated circuit device including a 3D array of cells 1960 arranged for execution of a sum-of-products operation. The cells in the 3D array disposed in cross-points of a plurality of vertical lines and a plurality of horizontal lines, the cells having charge storage structures disposed at cross-points of the plurality of vertical lines and the plurality of horizontal lines. One of the plurality of vertical lines and the plurality of horizontal lines can comprise cell body lines, and the other of the plurality of vertical lines and the plurality of horizontal lines can comprise gate lines.

The cell body lines each comprise parallel first and second conductive lines extending along the cell body line, and a plurality of cell bodies at cross-points with gate lines, the cell bodies connected between the first and second conductive lines and configured as first and second source/drain terminals and channels of cells in the 3D array. The gate lines 1945 each comprise a conductor configured as control gates of cells in the 3D array, adjacent to the charge storage structures at cross-points with the cell body lines.

A plurality of input lines 1965 is connected to the first conductive lines in the cell body lines. A plurality of output lines 1955 is connected to the second conductive lines in the cell body lines.

A gate driver 1940 is coupled to the gate lines 1945 which applies control gate voltages which in combination with the charge in the charge storage structures of the cells corresponds to weights $W_{wyz}$ of terms in the sum-of-products operation, in response to address signals (e.g. on bus 1930) to select cells in the 3D array as terms in the sum-of-products operation.

An input driver 1970 is coupled to the plurality of input lines 1965 which applies voltages corresponding to input variables $X_y$. A sensing circuit 1950 is coupled to the plurality of output lines 1955 to sense a sum of currents in a set of output lines in the plurality of output lines, and is in turn coupled to the buffer circuits 1990 via a bus 1953 to store sensing results in the buffer circuits 1990.

The 3D array comprises a number X of input lines, a number Y of gate lines in each of a number Z of levels of cells, such that a stack of cells coupled to one of the input lines and one of the gate lines in each of the Z levels of cells includes Z cells in parallel between the one of the input lines and one of the output lines.

Addresses are supplied on bus 1930 from control logic (controller) 1910 to an input driver 1970 and a gate driver 1940. Voltage sensing sense amplifiers in circuits 1980 are coupled to the input driver 1970 via lines 1975, and are in turn coupled to buffer circuits 1990. Buffer circuits 1990 can be coupled with the sense amplifiers in circuits 1980 via a bus 1985 to store program data for programming of the transistors in the cells in the array. Buffer circuits 1990 can be coupled with the input/output circuits 1991 via a bus 1993. Also, the control logic 1910 can include circuits for selectively applying program voltages to the transistors in the cells in the array in response to the program data values in the buffer circuits 1990.

Input/output circuits 1991 drive the data to destinations external to the integrated circuit device 1900. Input/output data and control signals are moved via data bus 1905 between the input/output circuits 1991, the control logic 1910 and input/output ports on the integrated circuit device 1900 or other data sources internal or external to the integrated circuit device 1900, such as a general purpose processor or special purpose application circuitry, or a combination of modules providing system-on-a-chip functionality supported by the array of cells 1960.

The control logic 1910 is coupled to the buffer circuits 1990 and the array of cells 1960, and to other peripheral circuits used in memory access and in memory sum-of-products operations.

Control logic 1910, using a bias arrangement state machine, controls the application of supply voltages generated or provided through the voltage supply or supplies in block 1920, for memory operations in some embodiments. In other embodiments, control logic 1910, using a bias arrangement state machine, controls the application of supply voltages generated or provided through the voltage supply or supplies in block 1920, for sum-of-products operations.

The control logic 1910 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

Figure 20:
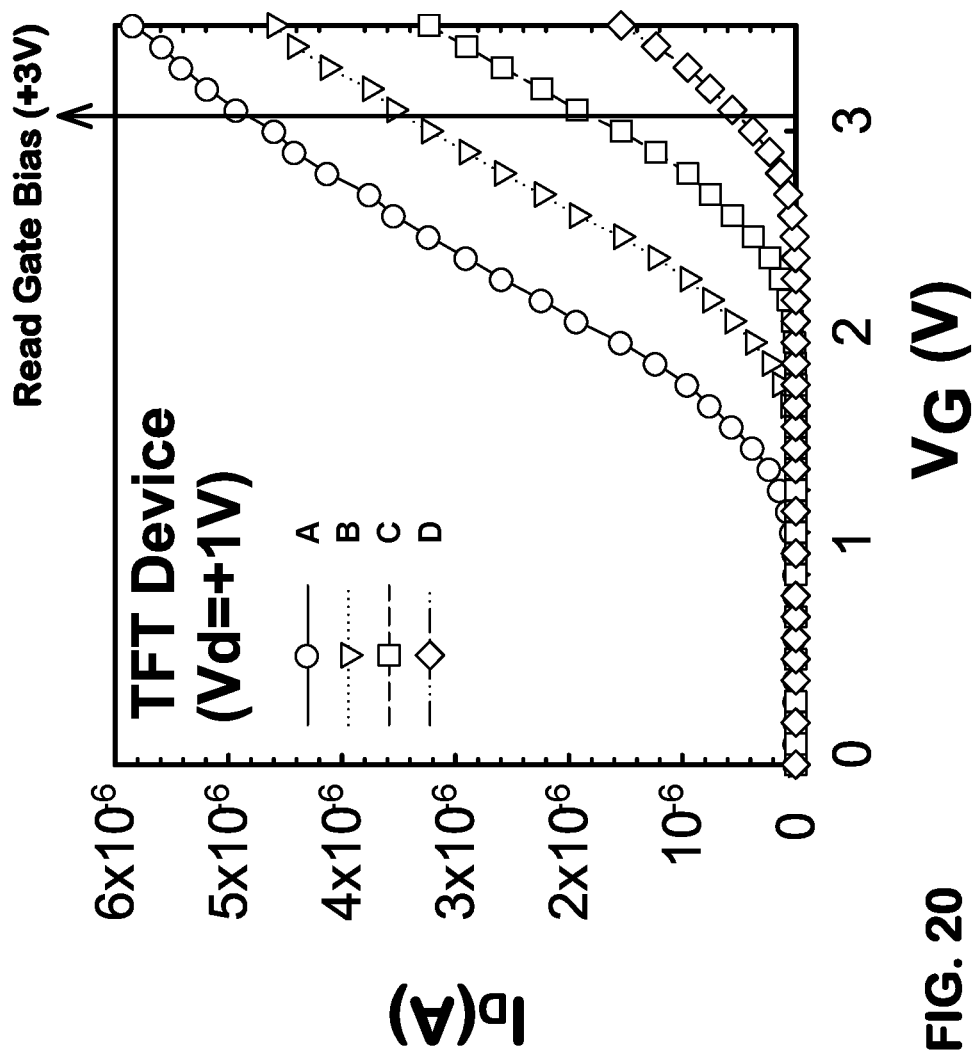
FIG. 20 illustrates Id-Vg characteristics for cells in a 3D array of cells arranged for execution of a sum-of-products operation.

FIG. 20 illustrates Id-Vg curves for thin film transistor dielectric charge trapping cells (BE-SONOS) representative of cells suitable for use in a 3D array of cells arranged for execution of a sum-of-products operation. For instance, cells can be progressively programmed for the conductance as a function of biasing voltages by setting threshold voltages Vt of the cells. The plot shows IV curves for cells with Vt=1V (A state), Vt=1.7V (B state), Vt=2.2V (C state) and Vt=2.5V (D state). At a constant read gate voltage (e.g. Vg=+3V), the read current $I_D$ ranges in the four cells from 5 μA (5×10$^{-6}$) to 0 μA at Vd=+1V. The programmable conductance range of the cells is 5 μA/V to 0 μV. For a sum-of-products operation using multi-level cells (MLC), conductance distribution is more important than threshold voltage distribution, and therefore program-verify can be used to tighten the conductance distribution instead of threshold voltage distribution.

Figure 21:
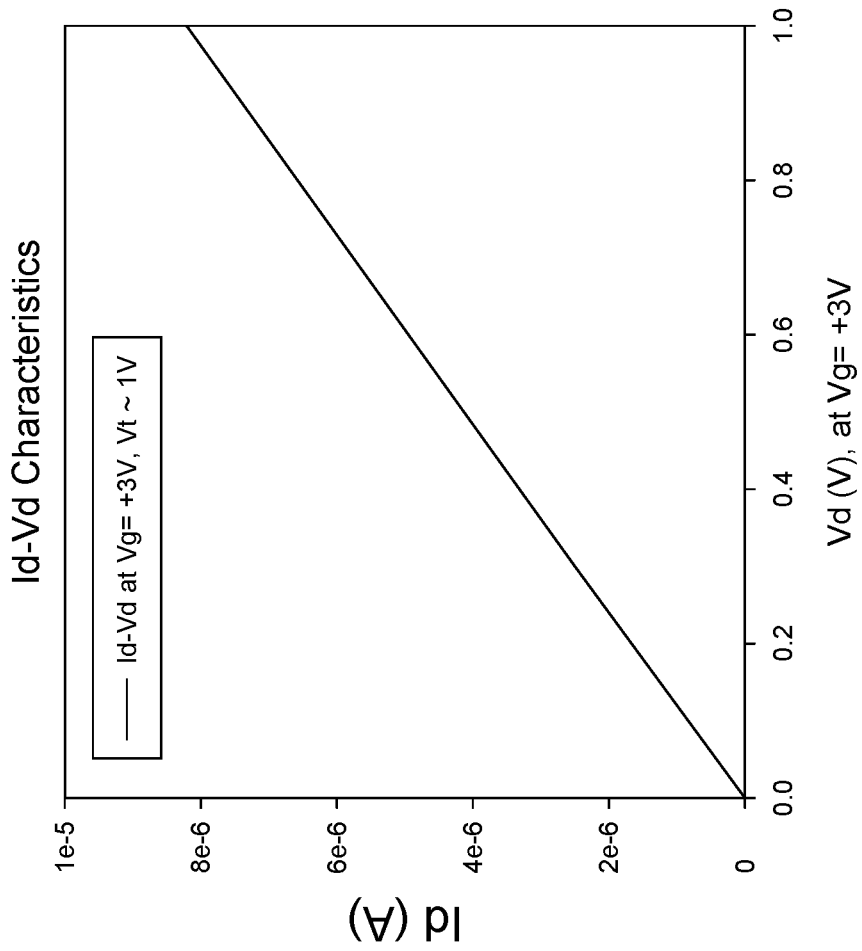
FIG. 21 illustrates Id-Vd characteristics for cells in a 3D array of cells arranged for execution of a sum-of-products operation.

FIG. 21 illustrates Id-Vd characteristics for thin film transistor dielectric charge trapping cells (BE-SONOS) representative of cells in a 3D array of cells arranged for execution of a sum-of-products operation. To execute a sum-of-products operation, linearity of Id-Vd (conductance) characteristics is desirable. FIG. 21 illustrates measured data on TFT (thin-film-transistor) cells at Vd<1V, Vt=1V, and read gate voltage Vg=+3V, which shows linearity of Id-Vd characteristics.

Figure 22:
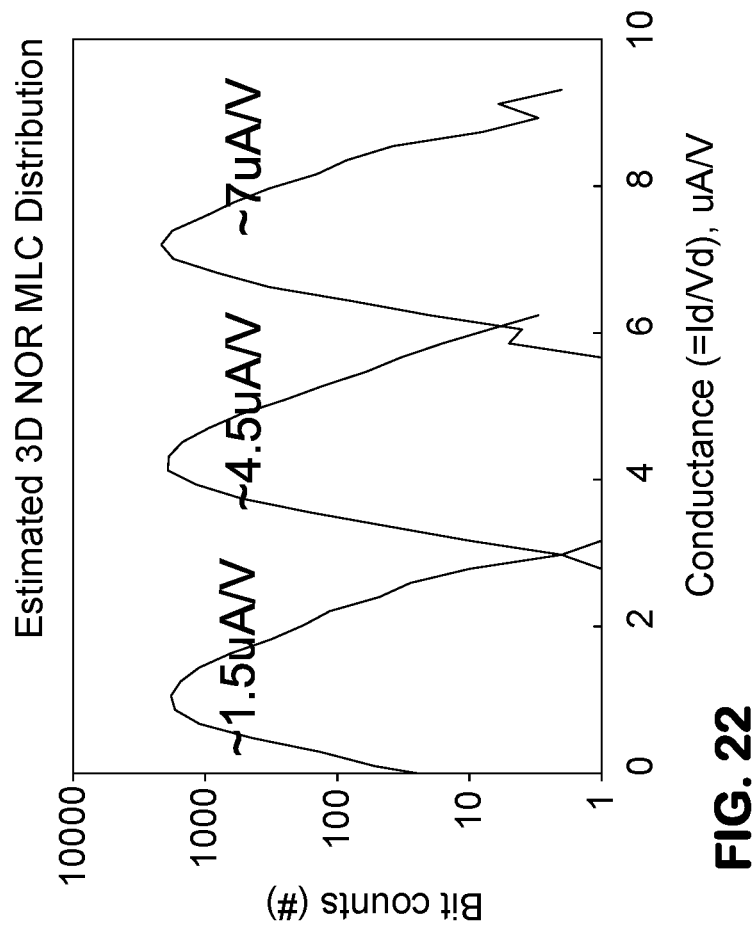
FIG. 22 illustrates an example estimated conductance distribution in a 3D array of cells arranged for execution of a sum-of-products operation.

FIG. 22 illustrates an example estimated conductance distribution in a 3D configuration as described herein, arranged for execution of a sum-of-products operation. Cells in the array of cells can be multi-level cells (MLC) in this example. Conductance distribution is estimated to have 4 levels at a constant Vg=+3.5V:

A: conductance=0 μA/V (at Vt>3.5V)
B: conductance=about 1.5 μA/V
C: conductance=about 4.5 μA/V
D: conductance=about 7 μA/V By controlling program voltages and read voltages, different conductance distributions can be designed according to different design sensing requirements.

Figure 23:
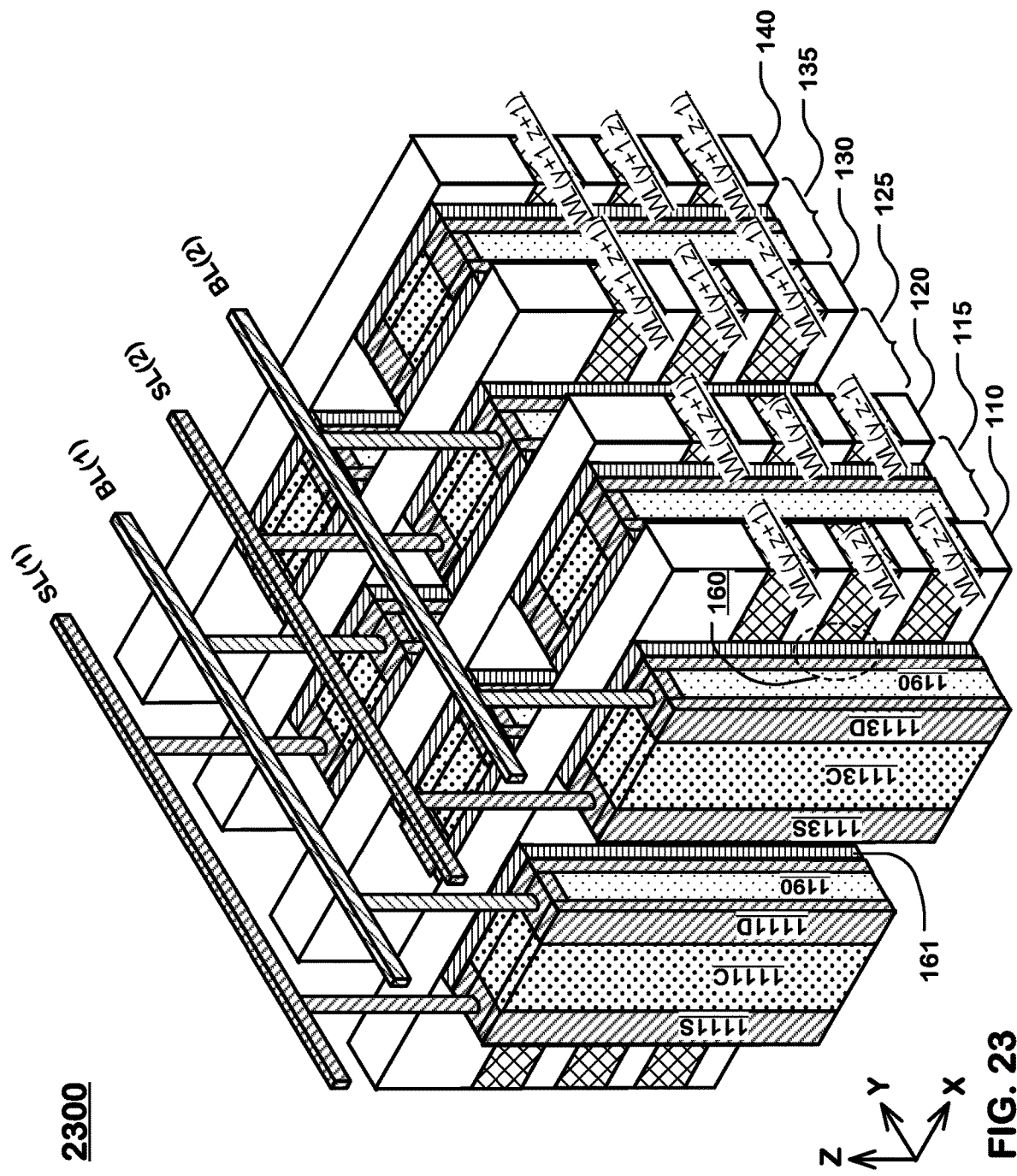
FIG. 23 illustrates a second embodiment in accordance with the present technology in a 3D stackable AND Flash architecture.

FIG. 23 illustrates a second embodiment in accordance with the present technology in a 3D stackable AND Flash architecture, with reduced density in a 3D array of cells. The second embodiment describes a 3D array of cells 2300 arranged for execution of a sum-of-products operation.

Like the first embodiment described in reference to FIG. 1, in the second embodiment, the cells in the 3D array (e.g. 160) are disposed in cross-points of cell body lines and gate lines (e.g. WL(y, z−1), WL(y, z) and WL(y, z+1)). The gate lines comprise a plurality of stacks of conductive strips (e.g. 110, 120, 130, 140) separated by trenches (e.g. 115, 125, 135), and the cell body lines are disposed vertically in the trenches. The cells have charge storage structures (e.g. 161) disposed at cross-points of the cell body lines and gate lines.

The cell body lines comprise semiconductor strips having a first conductively doped region configured as the first conductive line (e.g. 1111D), a second conductively doped region configured as the second conductive line (e.g. 1111S), and a third region (e.g. 1111C) between the first and second conductively doped regions having a doping profile of the channels of the cells. Isolation structures (e.g. 910) are disposed between the semiconductor strips.

A plurality of input lines (e.g. BL(1), BL(2)) is connected to the first conductive lines (e.g. 1111D, 1113D) in the cell body lines. A plurality of output lines (e.g. SL(1), SL(2)) is connected to the second conductive lines (e.g. 1111S, 1113S) in the cell body lines.

The second embodiment can include a gate driver 1940 (FIG. 19) coupled to the gate lines, an input driver 1970 (FIG. 19) coupled to the plurality of input lines, and a sensing circuit 1950 (FIG. 19) coupled to the plurality of output lines, as described for the first embodiment.

One difference with the first embodiment is that in the second embodiment, stacks of cells in alternate rows of stacks of cells are coupled to input lines and output lines, while between the alternate rows of stacks of cells which are coupled to input lines and output lines, there are no cells in rows of stacks of cells which are coupled to input lines and output lines. The rows of stacks of cells not coupled to input lines and output lines can be referred to as empty regions. With the reduced number of input lines (e.g. BL(1), BL(2)) and output lines (e.g. SL(1), SL(2)), the X-pitch can be doubled for processing of input lines and output lines as compared to the X-pitch shown in FIG. 2A for the first embodiment. The empty regions can improve device performance by reducing interference in the column direction (Y-direction), and reducing the number of gates lines needed to be routed and decoded.

Figure 24:
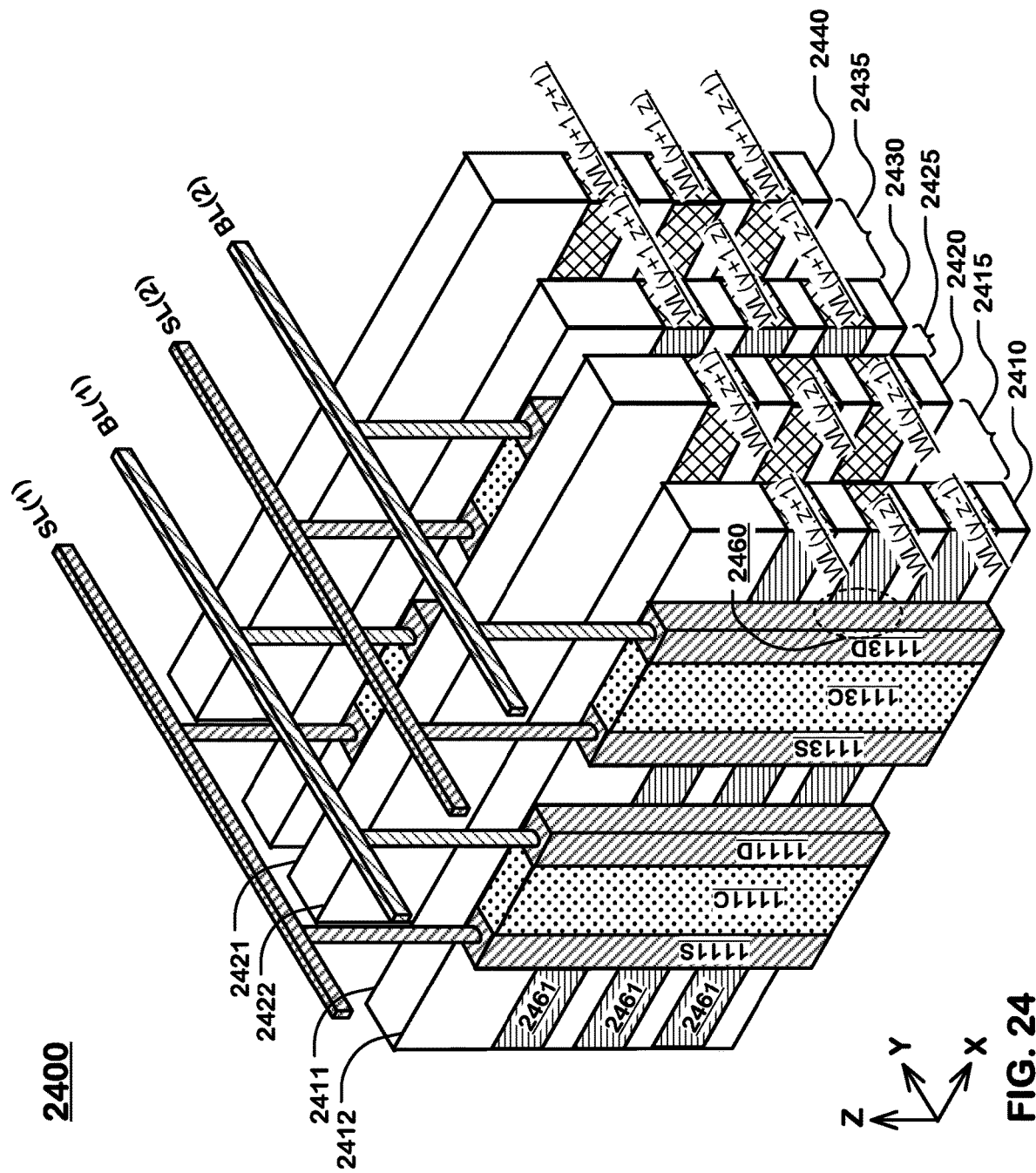
FIG. 24 illustrates a third embodiment in accordance with the present technology in a 3D stackable AND Flash architecture.

FIG. 24 illustrates a third embodiment in accordance with the present technology in a 3D stackable AND Flash architecture, where a gate replacement process is used to form the device, using trenches between adjacent stacks of sacrificial strips. The third embodiment describes a 3D array of cells 2400 arranged for execution of a sum-of-products operation.

Like the first embodiment described in reference to FIG. 1, in the third embodiment, the cells in the 3D array (e.g. 2460) are disposed in cross-points of cell body lines and gate lines (e.g. WL(y,z)). The gate lines comprise a plurality of stacks of conductive strips (e.g. 2410, 2420, 2430, 2440) separated by trenches (e.g. 2415, 2425, 2435), and the cell body lines are disposed vertically in the trenches. The cells have charge storage structures (e.g. 2461) disposed at cross-points of the cell body lines and gate lines.

The cell body lines comprise semiconductor strips having a first conductively doped region configured as the first conductive line (e.g. 1111D, 1113D), a second conductively doped region configured as the second conductive line (e.g. 1111S, 1113S), and a third region (e.g. 1111C, 1113C) between the first and second conductively doped regions having a doping profile of the channels of the cells.

A plurality of input lines (e.g. BL(1), BL(2)) is connected to the first conductive lines (e.g. 1111D) in the cell body lines. A plurality of output lines (e.g. SL(1), SL(2)) is connected to the second conductive lines (e.g. 1111S) in the cell body lines.

The third embodiment can include a gate driver 1940 (FIG. 19) coupled to the gate lines, an input driver 1970 (FIG. 19) coupled to the plurality of input lines, and a sensing circuit 1950 (FIG. 19) coupled to the plurality of output lines, as described for the first embodiment.

One difference with the first embodiment is that in the third embodiment, rows of stacks of cells are formed in alternate trenches (e.g. 2425) between stacks of conductive strips (e.g. 2420, 2430), while rows of stacks of cells are not formed in trenches (e.g. 2415, 2435) between the alternate trenches having rows of stacks of cells. The trenches not having rows of stacks of cells can be used in a gate replacement process to form the conductive strips in the stacks of conductive strips.

For instance, to form first and second stacks of conductive strips (e.g. 2410, 2420), a gate replacement process can include the following steps:

forming first and second stacks of sacrificial strips each having a first sidewall and a second sidewall on a substrate, the second sidewall (e.g. 2422) of the second stack of sacrificial strips opposed to the first sidewall (e.g. 2411) of the first stack of sacrificial strips, the first and second stacks of sacrificial strips being separated by a trench (e.g. 2415);

forming semiconductor strips on the first sidewall (e.g. 2421) of the second stack of sacrificial strips and on the second sidewall (e.g. 2412) of the first stack of sacrificial strips the semiconductor strips each having a first conductively doped region configured as the first conductive line, a second conductively doped region configured as the second conductive line, and a third region between the first and second conductively doped regions having a doping profile of the channels of the cells;

removing the sacrificial strips in the first and second stacks of sacrificial strips via the trench to form openings;

forming layers of material used as charge storage structures (e.g. 2461) in the openings on sidewalls of the semiconductor film via the trench; and forming conductive strips (e.g. WL(y,z)) in the openings in contact with the layers of material used as the charge storage structures.

Another difference with the first embodiment is that in the third embodiment, a single semiconductor strip is disposed in a trench (e.g. 2425) on sidewalls of adjacent stacks of conductive strips (e.g. 2420, 2430). In comparison, in the first embodiment illustrated by FIG. 1, an isolation structure is disposed between semiconductor strips in a trench on sidewalls of adjacent stacks of conductive strips.

Figure 25:
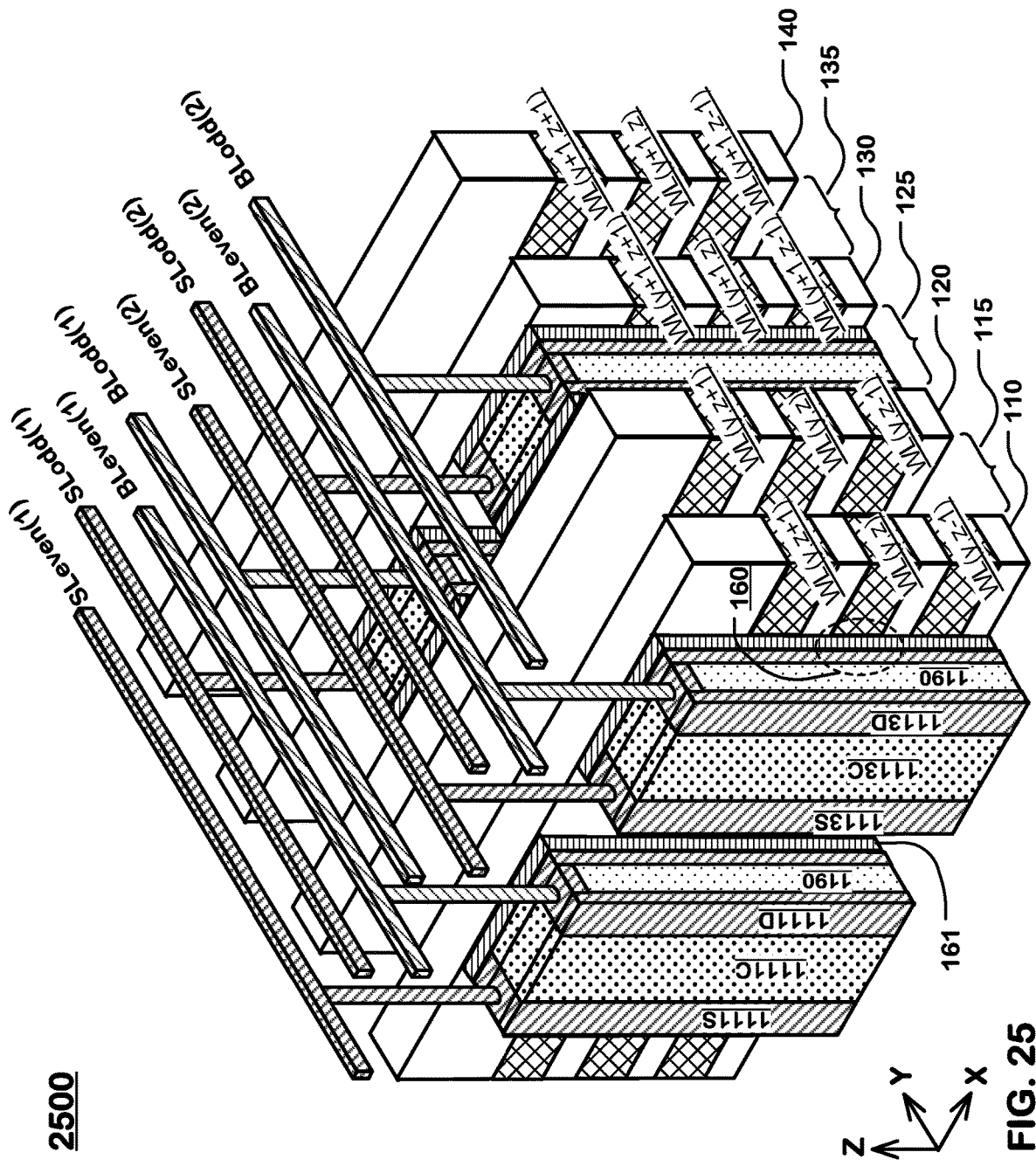
FIG. 25 illustrates a fourth embodiment in accordance with the present technology in a 3D stackable AND Flash architecture.

FIG. 25 illustrates a fourth embodiment in accordance with the present technology in a 3D stackable AND Flash architecture, where rows of stacks of cells are formed in alternate trenches and not formed in trenches between the alternate trenches having rows of stacks of cells. The fourth embodiment describes a 3D array of cells 2500 arranged for execution of a sum-of-products operation. Also, the stacks are disposed in a twisted array, with offsets in the bit line direction on alternate rows, enabling higher density of output lines.

Like the first embodiment described in reference to FIG. 1, in the fourth embodiment, the cells in the 3D array (e.g. 160) are disposed in cross-points of cell body lines and gate lines (e.g. WL(y, z−1), WL(y, z) and WL(y, z+1)). The gate lines comprise a plurality of stacks of conductive strips (e.g. 110, 120, 130, 140) separated by trenches (e.g. 115, 125, 135), and the cell body lines are disposed vertically in the trenches. The cells have charge storage structures (e.g. 161) disposed at cross-points of the cell body lines and gate lines.

The cell body lines comprise semiconductor strips having a first conductively doped region configured as the first conductive line (e.g. 1111D), a second conductively doped region configured as the second conductive line (e.g. 1111S), and a third region (e.g. 1111C) between the first and second conductively doped regions having a doping profile of the channels of the cells. Isolation structures (e.g. 1190) are disposed between the semiconductor strips.

A plurality of input lines (e.g. BLeven(1)) is connected to the first conductive lines (e.g. 1111D) in the cell body lines. A plurality of output lines (e.g. SLeven(1)) is connected to the second conductive lines (e.g. 1111S) in the cell body lines.

The fourth embodiment can include a gate driver 1940 (FIG. 19) coupled to the gate lines, an input driver 1970 (FIG. 19) coupled to the plurality of input lines, and a sensing circuit 1950 (FIG. 19) coupled to the plurality of output lines, as described for the first embodiment.

One difference with the first embodiment is that in the fourth embodiment, rows of stacks of cells are formed in alternate trenches (e.g. 125) between stacks of conductive strips (e.g. 120, 130), while rows of stacks of cells are not formed in trenches (e.g. 115, 135) between the alternate trenches having rows of stacks of cells. The trenches not having rows of stacks of cells can be used in a gate replacement process to form the conductive strips in the stacks of conductive strips, for example, as described in reference to FIG. 24 for the third embodiment.

Gate lines (e.g. WL(y,z)) at corresponding levels in two adjacent stacks of conductive strips (e.g. 110 and 120) between which is a trench (e.g. 115) not having rows of stacks of cells can be coupled for gate line decoding, to save area for gate line decoding circuitry.

Figure 26:
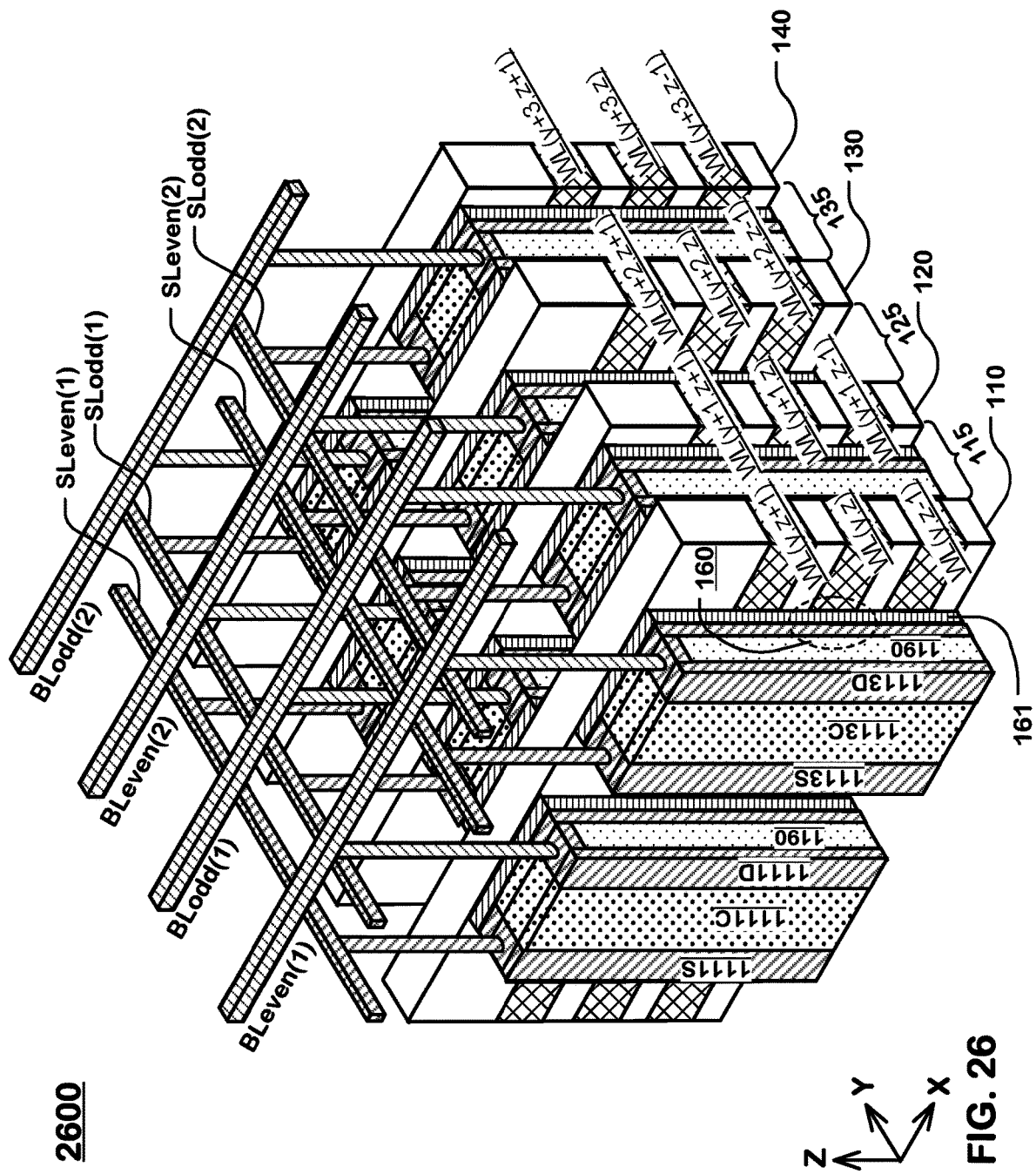
FIG. 26 illustrates a fifth embodiment in accordance with the present technology in a 3D stackable NOR Flash architecture.

FIG. 26 illustrates a fifth embodiment in accordance with the present technology, where the input lines are arranged orthogonal to the output lines. The fifth embodiment describes a 3D array of cells 2600 arranged for execution of a sum-of-products operation in a 3D stackable NOR Flash architecture.

Like the 3D stackable AND Flash architecture described in reference to FIG. 1, in the fifth embodiment, the cells in the 3D array (e.g. 160) are disposed in cross-points of cell body lines and gate lines (e.g. WL(y, z−1), WL(y, z) and WL(y, z+1)). The gate lines comprise a plurality of stacks of conductive strips (e.g. 110, 120, 130, 140) separated by trenches (e.g. 115, 125, 135), and the cell body lines are disposed vertically in the trenches. The cells have charge storage structures (e.g. 161) disposed at cross-points of the cell body lines and gate lines.

The cell body lines comprise semiconductor strips having a first conductively doped region configured as the first conductive line (e.g. 1111D), a second conductively doped region configured as the second conductive line (e.g. 1111S), and a third region (e.g. 1111C) between the first and second conductively doped regions having a doping profile of the channels of the cells. Isolation structures (e.g. 1190) are disposed between the semiconductor strips.

A plurality of input lines (e.g. BLeven(1)) is connected to the first conductive lines (e.g. 1111D) in the cell body lines. A plurality of output lines (e.g. SLeven(1)) is connected to the second conductive lines (e.g. 1111S) in the cell body lines.

The fifth embodiment can include a gate driver 1940 (FIG. 19) coupled to the gate lines, an input driver 1970 (FIG. 19) coupled to the plurality of input lines, and a sensing circuit 1950 (FIG. 19) coupled to the plurality of output lines, as described for the first embodiment.

One difference with the first embodiment described in reference to FIG. 1 is that the fifth embodiment includes a plurality of output lines (SLeven(1), SLodd(1), SLeven(2), SLodd(2)) arranged orthogonal to a plurality of input lines (e.g. BLeven(1), BLodd(1), BLeven(2), BLodd(2)). For instance, in the fifth embodiment, a plurality of input lines can extend along the rows in a first direction (the X-direction) along which the conductive strips (e.g. WL(y, z)) in the stacks of conductive strips extend and be arranged in a second direction (the Y-direction) orthogonal to the first direction, while a plurality of output lines can extend in the second direction orthogonal to the first direction and be arranged in the first direction. In comparison, the first embodiment can include a plurality of input lines and a plurality of output lines both extending in the second direction orthogonal to the first direction and both being arranged in the first direction.

In the fifth embodiment, input lines in the plurality of input lines can be connected to the first conductive lines (e.g. 1111D) in the cell body lines in respective rows of stacks of cells in a row direction (X-direction), and output lines in the plurality of output lines can be connected to the second conductive lines (e.g. 1111S) in the cell body lines in respective columns of stacks of cells in a column direction (Y-direction) orthogonal to the row direction.

In the fifth embodiment, the sum-of-products operation can be carried out through the summation of output current on an output line from various input lines.

As shown in the example of FIG. 26, the sum-of-products operation can be carried out through the summation of source current on a first even output line SLeven(1) from a first even bit line BLeven(1) and a second even bit line BLeven(2) through cells in stacks of cells in the Z levels at row (y) and row (y+2) and column (x) of the array. The sum-of-products operation can be carried out through the summation of source current on a first odd output line SLodd(1) from a first odd bit line BLodd(1) and a second odd bit line BLodd(2) through cells in stacks of cells in the Z levels at row (y+1) and row (y+3) and column (x+1) of the array.

As shown in the example of FIG. 26, the sum-of-products operation can be carried out through the summation of source current on a second even output line SLeven(2) from the first even bit line BLeven(1) and the second even bit line BLeven(2) through cells in stacks of cells in the Z levels at row (y) and row (y+2) and column (x+2) of the array. The sum-of-products operation can be carried out through the summation of source current on a second odd output line SLodd(2) from the first odd bit line BLodd(1) and the second odd bit line BLodd(2) through cells in stacks of cells in the Z levels at row (y+1) and row (y+3) and column (x+3) of the array.

A 3D stackable NOR Flash architecture for memory and for AI applications is described that can support the AI application of "in-memory sum-of-products" computation. It possesses high-density, high-bandwidth, NOR-type random access speed, to meet the AI memory requirements. Also, this 3D NOR described is usable for a fast random access memory with high density and low cost.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device, comprising:
    a 3D array of cells arranged for execution of a sum-of-products operation, the cells in the 3D array disposed in cross-points of a plurality of vertical lines and a plurality of horizontal lines, the cells having programmable conductances;
    a gate driver coupled to gate lines which applies control gate voltages which in combination with the programmable conductances of the cells correspond to weights $W_{xyz}$ of terms in the sum-of-products operation;
    an input driver which applies voltages to cells in the array corresponding to input variables $X_y$; and
    a sensing circuit to sense a sum of currents from cells in the 3D array corresponding to the sum-of-products.

2. The device of claim 1, wherein:
    one of the plurality of vertical lines and the plurality of horizontal lines comprises cell body lines, and the other of the plurality of vertical lines and the plurality of horizontal lines comprises gate lines;
    the cell body lines each comprise parallel first and second conductive lines extending along the cell body line, and a plurality of cell bodies including charge storage structures at cross-points with gate lines, the cell bodies connected between the first and second conductive lines and configured as first and second source/drain terminals and channels of cells in the 3D array; and
    the gate lines each comprise a conductor configured as control gates of cells in the 3D array, adjacent to the charge storage structures; and the device includes:
        a plurality of input lines connected to the input driver and to the first conductive lines in the cell body lines; and
        a plurality of output lines connected to the sensing circuit and to the second conductive lines in the cell body lines.

3. The device of claim 2, wherein the cell body lines comprise semiconductor strips having a first conductively doped region configured as the first conductive line, a second conductively doped region configured as the second conductive line, and a third region between the first and second conductively doped regions having a doping profile of the channels of the cells.

4. The device of claim 2, wherein vertical lines in the plurality of vertical lines are the cell body lines.

5. The device of claim 4, wherein the gate lines comprise a plurality of stacks of conductive strips separated by trenches, and the cell body lines are disposed vertically in the trenches.

6. The device of claim 4, wherein the gate lines comprise a plurality of stacks of conductive strips separated by trenches, and the cell body lines comprise semiconductor strips disposed vertically in the trenches, the semiconductor strips having a first conductively doped region configured as the first conductive line, a second conductively doped region configured as the second conductive line, and a third region between the first and second conductively doped regions having a doping profile of the channels of the cells.

7. The device of claim 2, wherein vertical lines in the plurality of vertical lines are the gate lines.

8. The device of claim 7, wherein the cell body lines comprise a plurality of stacks semiconductor strips separated by trenches, the semiconductor strips having a first conductively doped region configured as the first conductive line, a second conductively doped region configured as the second conductive line, and a third region between the first and second conductively doped regions having a doping profile of the channels of the cells, and the gate lines comprise a plurality of conductive strips disposed vertically in the trenches.

9. The device of claim 2, wherein the 3D array comprises a number X of input lines, a number Y of gate lines in each of a number Z of levels of cells, such that a stack of cells coupled to one of the input lines and one of the gate lines in each of the Z levels of cells includes Z cells in parallel between the one of the input lines and one of the output lines.

10. A device, comprising:
an array of cells having a number X of columns, a number Y of rows and a number Z of levels of cells, cells in the array each comprising a transistor having programmable conductance;
gate lines arranged along the Y rows in corresponding levels of the Z levels coupled to the cells in respective rows in the corresponding levels;
input lines arranged along the X columns and overlying the array;
output lines overlying the array; and
a stack of cells in the Z levels of the array at a given row (y) and column (x) of the array including a first vertical conductive line and a second vertical conductive line, the first vertical conductive line connected to a corresponding input line on the given column (x) and the second vertical conductive line connected to an output line,
wherein the transistors in the cells in the stack are electrically coupled in parallel between corresponding first and second vertical conductive lines.

11. The device of claim 10, comprising a sensing circuit coupled to the output lines.

12. A device, comprising:
an array of cells having a number X of columns, a number Y of rows and a number Z of levels of cells, cells in the array each comprising a transistor having programmable conductance;
gate lines arranged along the Y rows in corresponding levels of the Z levels coupled to the cells in respective rows in the corresponding levels;
input lines arranged along the X columns and overlying the array;
output lines overlying the array; and
a stack of cells in the Z levels of the array at a given row (y) and column (x) of the array including a first vertical conductive line and a second vertical conductive line, the first vertical conductive line connected to a corresponding input line on the given column (x) and the second vertical conductive line connected to an output line,
wherein the transistors in the cells in the stack are electrically coupled in parallel between corresponding first and second vertical conductive lines,
wherein current on a particular stack at row y and column x represents a sum-of-products of the input i(x) applied to the input line on column x coupled to the particular stack by respective weight factors W(x, y, z) of the cells in the Z levels in the particular stack.

13. The device of claim 12, wherein for an output line coupled to a plurality of stacks, the current on the output line represents a sum of the currents on the plurality of stacks including the particular stack.

14. The device of claim 12, comprising:
a plurality of stacks of conductive strips separated by trenches, each of the stacks having a first sidewall and a second sidewall;
charge storage structures on the first and second sidewalls of the stacks of conductive strips;
a plurality of semiconductor strips disposed vertically in contact with the charge storage structures on the first and second sidewalls of the stacks of conductive strips, the semiconductor strips having a first conductively doped region configured as the first vertical conductive line, a second conductively doped region configured as the second vertical conductive line, and a third region between the first and second conductively doped regions having a doping profile of channels of the cells in the stack of cells;
cells in the stack of cells having first current carrying terminals in the first vertical conductive line, second current carrying terminals in the second vertical conductive line, the channels in the third region of the semiconductor strips, and gates in the conductive strips in the stacks of conductive strips; and
isolation structures between the semiconductor strips in the plurality of semiconductor strips.

15. The device of claim 14, comprising:
a first conductive element connecting the first vertical conductive line in a first semiconductor strip in the plurality of semiconductor strips and the first vertical conductive line in a second semiconductor strip in the plurality of semiconductor strips separated from the first semiconductor strip by an isolation structure; and
a second conductive element connecting the second vertical conductive line in the first semiconductor strip and the second vertical conductive line) in the second semiconductor strip.

16. The device of claim 15, comprising:
first interlayer connectors connecting the input lines to respective first conductive elements; and
second interlayer connectors connecting the output lines to respective second conductive elements.

17. The device of claim 14, the first-mentioned stack of cells being disposed on the first sidewall of a particular stack of conductive strips in the plurality of stacks of conductive strips, comprising:
a second stack of cells in the Z levels of the array at the given row (y) and column (x+1) of the array, the second stack of cells being disposed on the second sidewall of the particular stack of conductive strips,
wherein the first-mentioned stack of cells is offset from the second stack of cells in a direction along which the conductive strips in the particular stack of conductive strips extend.

18. A device, comprising:
a 3D array of cells arranged for execution of a sum-of-products operation, the cells in the 3D array disposed in cross-points of a plurality of vertical lines and a plurality of horizontal lines, the cells having programmable conductances;

a gate driver coupled to gate lines which applies control gate voltages which in combination with the programmable conductances of the cells correspond to weights $W_{xyz}$ of terms in the sum-of-products operation;
an input driver which applies voltages to cells in the array corresponding to input variables $X_y$;
a sensing circuit to sense a sum of currents from cells in the 3D array corresponding to the sum-of-products;
a plurality of input lines connected to the input driver; and
a plurality of output lines connected to the sensing circuit, wherein the plurality of output lines is arranged orthogonal to the plurality of input lines.

19. The device of claim 18, wherein:
one of the plurality of vertical lines and the plurality of horizontal lines comprises cell body lines, and the other of the plurality of vertical lines and the plurality of horizontal lines comprises gate lines;
the cell body lines each comprise parallel first and second conductive lines extending along the cell body line, and a plurality of cell bodies including charge storage structures at cross-points with gate lines, the cell bodies connected between the first and second conductive lines and configured as first and second source/drain terminals and channels of cells in the 3D array;
the gate lines each comprise a conductor configured as control gates of cells in the 3D array, adjacent to the charge storage structures;
the input lines in the plurality of input lines are connected to the first conductive lines in the cell body lines in respective rows of stacks of cells in a row direction; and
the output lines in the plurality of output lines are connected to the second conductive lines in the cell body lines in respective columns of stacks of cells in a column direction orthogonal to the row direction.

20. The device of claim 19, wherein the cell body lines comprise semiconductor strips having a first conductively doped region configured as the first conductive line, a second conductively doped region configured as the second conductive line, and a third region between the first and second conductively doped regions having a doping profile of the channels of the cells.

* * * * *